(12) United States Patent
Stowell et al.

(10) Patent No.: US 10,472,497 B2
(45) Date of Patent: Nov. 12, 2019

(54) COMPOSITE MATERIALS SYSTEMS CONTAINING CARBON AND RESIN

(71) Applicant: Lyten, Inc., Sunnyvale, CA (US)

(72) Inventors: Michael W. Stowell, Sunnyvale, CA (US); Bryce H. Anzelmo, Mountain View, CA (US); Bruce Lanning, Littleton, CO (US); Daniel Cook, Woodside, CA (US); Shreeyukta Singh, Sunnyvale, CA (US)

(73) Assignee: LytEn, Inc., Sunnyvale, CA (US)

( * ) Notice: Subject to any disclaimer, the term of this patent is extended or adjusted under 35 U.S.C. 154(b) by 0 days.

(21) Appl. No.: 16/284,764

(22) Filed: Feb. 25, 2019

(65) Prior Publication Data

US 2019/0264004 A1 Aug. 29, 2019

Related U.S. Application Data

(60) Provisional application No. 62/711,016, filed on Jul. 27, 2018, provisional application No. 62/636,710, filed on Feb. 28, 2018.

(51) Int. Cl.

| | | |
|---|---|---|
| *C08K 9/02* | (2006.01) | |
| *C01B 32/194* | (2017.01) | |
| *C08K 3/04* | (2006.01) | |
| *C08K 11/00* | (2006.01) | |
| *C08K 13/08* | (2006.01) | |
| *H01J 37/32* | (2006.01) | |

(52) U.S. Cl.
CPC .............. *C08K 9/02* (2013.01); *C01B 32/194* (2017.08); *C08K 3/04* (2013.01); *C08K 11/00* (2013.01); *C08K 13/08* (2013.01); *H01J 37/32229* (2013.01); *C01B 2204/02* (2013.01); *C01B 2204/04* (2013.01); *C01B 2204/30* (2013.01); *C01P 2004/24* (2013.01); *C08K 2201/011* (2013.01); *H01J 2237/338* (2013.01)

(58) Field of Classification Search
CPC . C08K 3/04; C08K 9/02; C08K 11/00; C08K 13/08; C01B 32/194; H01J 37/32229
See application file for complete search history.

(56) References Cited

U.S. PATENT DOCUMENTS

| | | | |
|---|---|---|---|
| 8,632,633 | B2 | 1/2014 | Barker et al. |
| 9,767,992 | B1 | 9/2017 | Stowell et al. |
| 9,812,295 | B1 | 11/2017 | Stowell |
| 2010/0301212 | A1 | 12/2010 | Dato et al. |
| 2014/0014495 | A1 | 1/2014 | Dickinson et al. |
| 2015/0344643 | A1 | 12/2015 | Al-Harthi et al. |

FOREIGN PATENT DOCUMENTS

| | | |
|---|---|---|
| CN | 101559936 A | 10/2009 |
| WO | 2015099462 A1 | 7/2015 |

OTHER PUBLICATIONS

Andrews et al., Carbon nanotybe polymer composites, Current Opinion in Solid State and Metrials Science 8, 2004, pp. 31-37, Accepted Oct. 2003.
Collins, Defects and Disorder in Carbon Nanotubes, University of California at Irvine, to appear in Oxford Handbookk of Nanoscience and Technology: Frontiers and Advances, Jan. 2009, 73 pages.
Eggersdorfer et al., Fragmentation and restructuring of soft-agglomerates under shear, Journal of Colloid and Interface Science, vol. 342, Issue 2, Feb. 2010.
Guz et al., Predicting the properties of micro- and nanocomposites: from the microwhiskers to the bristled nano-centipedes, Phil. Trans. R. Soc. A, Jan. 2008, 366, 1827-1833.
Haskins et al., Control of Thermal and Electronic Transport in Defect-Engineered Graphene Nanoribbons, ACS Vano, vol. 5, No. 5, 3779-3787 Mar. 2011.
Kobashi et al., A dispersion strategy: dendritic carbon nanotube network dispersion for advanced composites, Chemical Science, Issue 2, 2013, First published on Nov. 6, 2012. 2 pages.
Kowbel et al., Effect of carbon fabric whiskerization on mechanical properties of C—C composites, Composites Part A: Applied Science and Manufacturing, vol. 28, Issue 12, 1997, Available online May 20, 1998, 993-1000.
Mittal et al., A review on carbon nanotubes and graphene as fillers in reinforced polymer nanocomposites, Journal of Industrial and Engineering Chemistry, 21, 2015, Available online Mar. 18, 2014, pp. 11-25.
Rwei et al., Observation of Carbon Black Agglomerate Dispersion in Simple Shear Flows, Polymer Engineering and Science, Jun. 1990, vol. 30, Nov 12, pp. 701-706.
Suraya et al., Evaluation of Carbon Vapour Deposition technique for whiskerization treatment of carbon fibers, International Journal of Engineering and Technology, vol. 3, No. 1, Jan. 2006, pp. 85-90.
Wagner et al., Stress-induced fragmentation of multiwall carbon nanotubes in a polymer matrix, Appl. Phys. Lett. 72, No. 2, Jan. 1988, pp. 188-190.

(Continued)

*Primary Examiner* — Edward J Cain
(74) *Attorney, Agent, or Firm* — Paradice and Li LLP

(57) ABSTRACT

Methods include producing a plurality of carbon particles in a plasma reactor, functionalizing the plurality of carbon particles in-situ in the plasma reactor to promote adhesion to a binder, and combining the plurality of carbon particles with the binder to form a composite material. The plurality of carbon particles comprises 3D graphene, where the 3D graphene comprises a pore matrix and graphene nanoplatelet sub-particles in the form of at least one of: single layer graphene, few layer graphene, or many layer graphene. Methods also include producing a plurality of carbon particles in a plasma reactor; functionalizing, in the plasma reactor, the plurality of carbon particles to promote chemical bonding with a resin; and combining, within the plasma reactor, the functionalized plurality of carbon particles with the resin to form a composite material.

20 Claims, 18 Drawing Sheets

(56) References Cited

OTHER PUBLICATIONS

Zhao et al., Shaping different carbon nano- and submicro-structures by alcohol chemical vapor deposition, Journal of Materials Research, vol. 21, No. 10, Oct. 2006, pp. 2504-2509.
International Search Report dated Jun. 12, 2019 for PCT Patent Application No. PCT/US2019/019812.

COMPOSITE MATERIALS SYSTEMS CONTAINING CARBON AND RESIN

RELATED APPLICATIONS

This application claims priority to U.S. Provisional Patent Application No. 62/636,710, filed on Feb. 28, 2018 and entitled "Composite Materials"; and to U.S. Provisional Patent Application No. 62/711,016, filed on Jul. 27, 2018 and entitled "Composite Materials"; all of which are hereby incorporated by reference for all purposes.

BACKGROUND

Composite materials are commonly formed by mixing carbon materials and sometimes fibers with polymer resins to enhance the properties of a formed composite, such as improved mechanical and electrical properties. For example, carbon can serve as a reinforcement material, providing high tensile strength to the formed composite while being lightweight. In another example, carbon can be used to increase electrical conductivity in a non-conductive polymer. Carbon can be added in the form of particles or fibers, where fibers may be used to provide directional properties. The types of carbon used as filler materials in carbon-resin composites typically are carbon black, graphene, and carbon nanotubes (CNTs).

Extensive research has been performed on ways to improve the performance of polymer composite materials. Mixing techniques such as solution mixing and melt processing, with associated parameters such as types of solvents and varying viscosities, have been studied to improve the uniformity of dispersion of carbon material in the resin. Aligning carbon fibers and CNTs within a polymer melt, and the effects of alignment on resulting properties of the formed composite have also been studied. Chemical techniques to functionalize carbon have been utilized to increase bonding interaction between carbon and polymer, including the formulation of nanocomposites. Whiskerization of carbon fibers through chemical avenues, such as chemical vapor deposition, has been investigated to improve mechanical strength between fibers and resin. Research has also been performed to optimize the amounts of carbon filler to add in various formulations, as too low of an amount will not achieve the desired properties while too much tends to lead to agglomeration of the filler particles, resulting in undesirable material performance.

Making carbon-resin composites to meet desired performance parameters is a complex area, particularly in that carbon-resin composite materials are used in a wide variety of applications that can require a wide range of properties.

SUMMARY

In some embodiments, methods of producing a composite material include producing a plurality of carbon particles in a plasma reactor, functionalizing the plurality of carbon particles in-situ in the plasma reactor to promote adhesion to a binder and combining the plurality of carbon particles with the binder to form a composite material. The plurality of carbon particles includes 3D graphene, where the 3D graphene comprises a pore matrix and graphene nanoplatelet sub-particles that comprise at least one of: single layer graphene, few layer graphene, or many layer graphene.

In some embodiments, methods of producing a composite material include producing a plurality of carbon particles in a plasma reactor; functionalizing, in the plasma reactor, the plurality of carbon particles to promote chemical bonding with a resin; and combining, within the plasma reactor, the functionalized plurality of carbon particles with the resin to form a composite material.

DETAILED DESCRIPTION

Figure 1A:
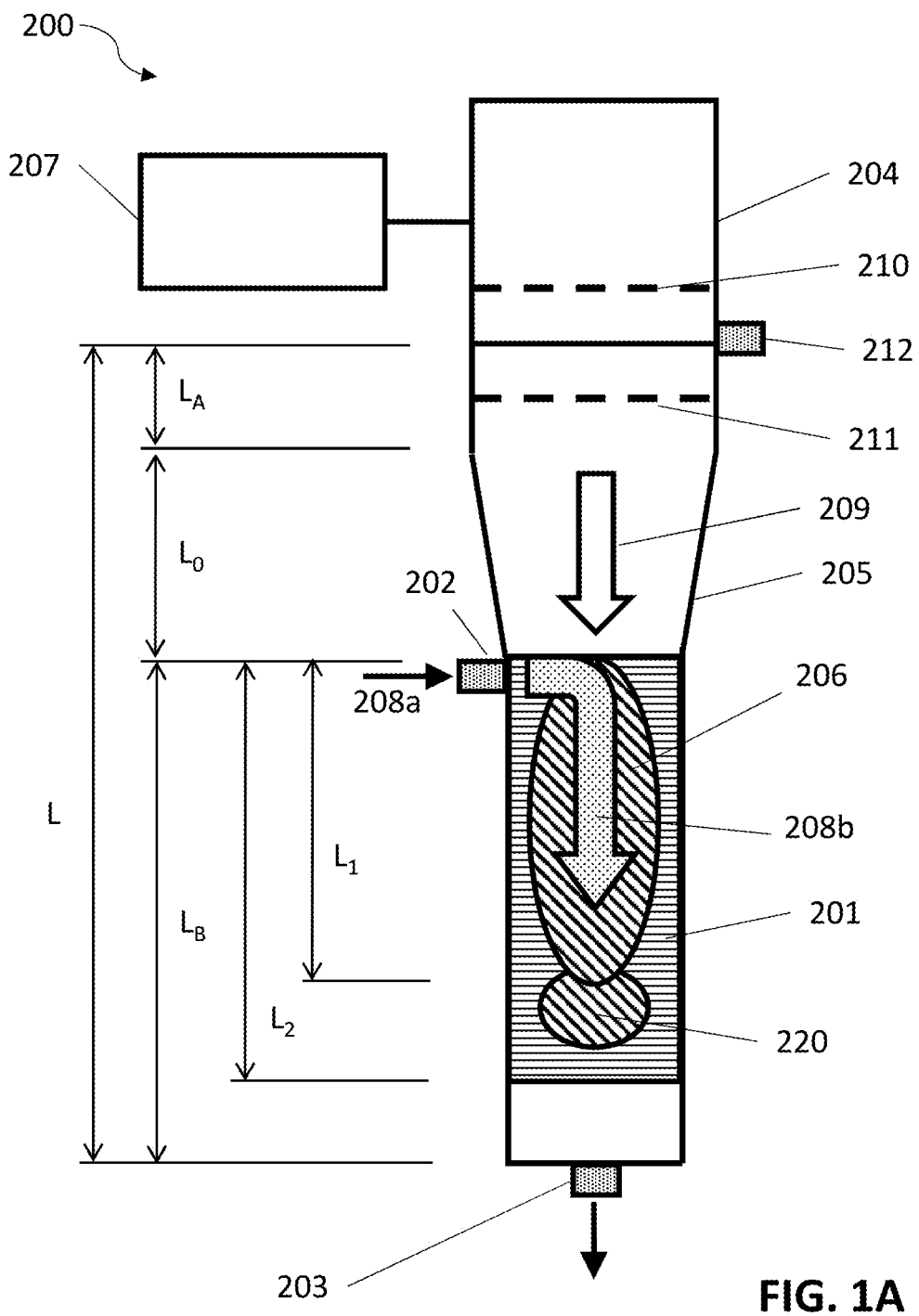
FIGS. 1A-1B are schematic diagrams of plasma reactors, in accordance with some embodiments.

The present embodiments disclose methods of fabricating carbon-resin composites through creation and functionalization of unique carbon materials using unique plasma reactors. Described in this disclosure are forms of carbon to be used in composite materials, methods of making carbon (including forming and functionalizing carbon materials), and methods of making carbon-resin composite materials. The carbon materials are incorporated into composite materials mixtures for customizing materials properties such as flexural modulus, tensile strength, compressive modulus, fracture toughness and interlaminar shear strength. These unique carbon additives can be tuned in their construction and concentration to provide final composite materials with desired properties. For example, the composite materials can be customized to have high strength and rigidity or to be semi-flexible. In another example, the composites can be tuned to have high moduli where minimal torsion and damaging relaxation is desired.

Embodiments include methods for creating and processing carbon materials for composite material production in situ in a plasma reactor, enabling streamlined processes and reducing the need for wet chemistry techniques compared to conventional methods. In some embodiments, carbon materials are created by a hydrocarbon cracking process in a microwave plasma reactor. Embodiments may include additional reactor technology, such as thermal reactors, in conjunction with plasma reactors. In some cases, the produced carbon materials are also functionalized to be compatible with a resin in a functionalization process occurring in the same plasma reactor as used to produce the carbon materials. In some embodiments, the created carbon materials are particles, with or without functionalization, which can be combined with resins in the reactor to form a composite material. The carbon particles that are used as starting materials for the present composite materials may include graphene, spherical carbons (carbon nano-onions (CNOs), which may also be referred to as multi-walled spherical fullerenes (MWSF) or multi-shell fullerenes), and/or carbon nanotubes (CNTs). The carbon particles may have a unique 3-dimensional (3D) structure in X, Y and Z dimensions, such as graphene structures that form a pore matrix (i.e., void spaces, cavities or openings) and that include sub-particles of single layer graphene (SLG), few layer graphene (FLG) and/or many layer graphene (MLG). The pore matrix and high surface area of the present 3D structures enhance interlocking of the resin with the carbon materials, improving the interfacial strength and adhesion between the resin and carbon materials and thus improving properties of the resulting composite material.

In some embodiments, the carbon particles are well-dispersed and highly integrated with the resin due to a 3D structure of the carbon materials and/or the functionalization of the carbon particles. For example, prior to being combined with the resin, the starting materials in various embodiments can be functionalized in a reactor, such as by chemical doping (e.g., using sulfur or metals) of the carbon particles or by attaching functional groups (e.g., hydroxides) and maintaining a specific environment within and around the materials to ensure and promote carbon-polymer bonding. The functionalizing can promote bonding of the carbon particles to the resin via chemical bonding, such as covalent bonding, ionic bonding, physical bonding i.e., hydrogen and/or pi-pi bonding, frictional forces or the combination thereof.

The carbon particles in various embodiments can be initially supplied into the composite material as nanometer to micron size aggregates. In some embodiments, the carbon aggregates or particles are broken into smaller particle sizes while being mixed with the resin, where newly-exposed carbon surfaces from the breaking up of the particles provide enhanced bonding to the resin compared to surfaces exposed to an ambient (non-resin) environment prior to being combined with the resin. In some embodiments, the carbon particles can be engineered with defects to control the locations of fracture and the sizes of the fragmented particles, thus providing customization of properties of the composite material.

Embodiments of the present composite materials may be any polymer system with the present carbon materials, and optionally with fiber reinforcement. In some embodiments, fibers such as carbon composite fillers (CCFs) or non-CCF materials are added to the composite materials. Enhancements provided by the present composite materials include, for example, increased toughness compared to conventional composites and moldable carbon materials (with or without non-CCF or CCF additives). The carbon materials add value to CCF composites by providing a stronger, tougher, customizable modulus (e.g., rigid versus flexible) than conventional CCF composites, and by providing injectable carbon matrix materials. In some embodiments, the fibers serve as a reinforcing material in addition to carbon particle additives and provide an additional parameter that can be tuned to adjust the properties of the composite materials (e.g., to form a carbon-resin composite material with anisotropic materials properties). In some embodiments, the fibers are introduced into the reactor to provide sites onto which the carbon particle additives are grown, thereby forming an integrated 3D structure for combining with a resin.

The carbon-resin composites and methods of making composites of the present disclosure provide numerous benefits. Some embodiments enable higher strength composites with improved qualities, such as toughened resins where plastic versus elastic behavior can be managed. In some embodiments, high strength can be achieved without increasing viscosity of the uncured polymer-carbon mixture, in contrast to conventional composites in which higher reinforcement typically leads to higher viscosity. In some embodiments, the present methods and materials also enable tunability, such as an ability to fabricate a specific carbon structure or backbone to chemically bond other materials or elements to the carbon, or such as to provide a specific orientation of carbon particles with respect to the polymer chains within the resin structure. Some embodiments enable the ability to engineer fracture planes into the carbon materials to allow for stress band orientation, leading to an end specification particle size that also enables customization of the composite material. In some embodiments, 3D-structured carbon materials provide a 3D growth network which results in superior carbon-polymer bonding.

3D carbon materials created by the present methods can enable improved composite properties. In one example, modification of energy transfer—that is, the distribution of force or stress to the resin, fibers and carbon particles within the composite matrix—is achieved within fiber-reinforced composite systems. In other words, the stress/energy transfer is allowed to spread out across a broader area/volume and can be diffused across several reinforced fiber plies or a larger polymer area. In another example, energy dissipation within the system is managed to relieve or concentrate forces, such as by engineering structures to allow for energy movement into or along a specified plane. In a further example, crack propagation is mitigated by stress termination that is enabled by the present carbon materials. Toughened resins may also be formulated, where plastic versus elastic behavior can be managed. In some embodiments, high strength can be achieved without increasing viscosity, in contrast to conventional composites in which higher reinforcement typically leads to higher viscosity.

Resin materials that may be combined with carbons to make the composite materials of the present disclosure include, but are not limited to, thermosets, thermoplastics, polyesters, vinyl esters, polysulfones, epoxies (including high viscosity epoxies), rigid amines, novolacs, polyimides, and other polymers systems or the combination thereof.

In this disclosure, the combined carbon and resin composite materials may be referred to as "carbon-resin composites," carbon-polymer composites," "composite materials," "composite materials systems," "matrix resin" or "composites." The terms "resin," "polymer" and "binder" shall be used interchangeably for the material to be combined with a type of carbon to form the composite material, in an uncatalyzed or pre-catalyzed state. The carbon particles that are mixed with the resin may be referred to as "starting particles," "added carbon particles", "carbon additives," or "filler." The terms "voids," "void spaces," "pores," or "pore matrix" shall be used interchangeably to mean spaces, cavities or openings within and around carbons, that may be through-holes or closed-end spaces and that form a continuous and/or discontinuous porous network or matrix.

Types of resin systems that may be combined with carbon to form the present composite materials include: resins in which a cross-linking agent or a hardening agent is used to cure the composite materials system; two-part systems in which a first is mixed with a second material that is a hardening agent; and thermoplastics that are above a glass transition temperature when the carbon is added. In some embodiments, the present carbon materials are functionalized with a first material and then are added to a second material, such that the carbon serves as a vehicle to add the first material to the second material (where one material may be a resin and the other material which may be a catalyst and/or cross linker). Additionally, the carbon particles may have resin and/or hardener surrounding or bonded to them and the carbon particles can be supplied to the missing or additional components to make the complete final composites system.

In the present disclosure, the term "graphene" refers to an allotrope of carbon in the form of a two-dimensional, atomic-scale, hexagonal lattice in which one atom forms each vertex. The carbon atoms in graphene are predominantly $sp^2$-bonded. Additionally, graphene has a Raman spectrum with three main peaks: a G-mode at approximately 1580 $cm^{-1}$, a D-mode at approximately 1350 $cm^{-1}$, and a 2D-mode peak at approximately 2690 $cm^{-1}$ (when using a 532 nm excitation laser). In the present disclosure, a single layer of graphene is a single sheet of hexagonally arranged (i.e., predominantly $sp^2$-bonded) carbon atoms. It is known that the ratio of the intensity of the 2D-mode peak to the G-mode peak (i.e., the 2D/G intensity ratio) is related to the number of layers in the graphene. A higher 2D/G intensity ratio corresponds to fewer layers in multilayer graphene materials. In different embodiments of the present disclosure, graphene contains fewer than 15 layers of carbon atoms, or fewer than 10 layers of carbon atoms, or fewer than 7 layers of carbon atoms, or fewer than 5 layers of carbon atoms, or fewer than 3 layers of carbon atoms, or contains a single layer of carbon atoms, or contains from 1 to 10 layers of carbon atoms, or contains from 1 to 7 layers of carbon atoms, or contains from 1 to 5 layers of carbon atoms. In some embodiments, few layer graphene (FLG) contains from 2 to 7 layers of carbon atoms. In some embodiments, many layer graphene (MLG) contains from 7 to 15 layers of carbon atoms.

In the present disclosure, the term "graphite" refers to an allotrope of carbon in the form of a two-dimensional, atomic-scale, hexagonal lattice in which one atom forms each vertex. The carbon atoms in graphite are predominantly $sp^2$-bonded. Additionally, graphite has a Raman spectrum with two main peaks: a G-mode at approximately 1580 $cm^{-1}$ and a D-mode at approximately 1350 $cm^{-1}$ (when using a 532 nm excitation laser). Similar to graphene, graphite contains layers of hexagonally arranged (i.e., predominantly $sp^2$-bonded) carbon atoms. In different embodiments of the present disclosure, graphite can contain greater than 15 layers of carbon atoms, or greater than 10 layers of carbon atoms, or greater than 7 layers of carbon atoms, or greater than 5 layers of carbon atoms, or greater than 3 layers of carbon atoms.

In the present disclosure, the term "fullerene" refers to a molecule of carbon in the form of a hollow sphere, ellipsoid, tube, or other shapes. Spherical fullerenes can also be referred to as Buckminsterfullerenes, or buckyballs. Cylindrical fullerenes can also be referred to as carbon nanotubes. Fullerenes are similar in structure to graphite, which is composed of stacked graphene sheets of linked hexagonal rings. Fullerenes may also contain pentagonal (or sometimes heptagonal) rings.

In the present disclosure, the term "multi-walled fullerene" refers to fullerenes with multiple concentric layers. For example, multi-walled nanotubes (MWNTs) contain multiple rolled layers (concentric tubes) of graphene. Multi-walled spherical fullerenes (MWSFs) which may also be referred to as multi-shell fullerenes (MSFs) contain multiple concentric spheres of fullerenes.

In the present disclosure, the term "particle" refers to a plurality of sub-particles or nanoparticles that are connected together by carbon-carbon bonds, Van der Waals forces, covalent bonds, ionic bonds, metallic bonds, or other physical or chemical interactions. Particles, which may also be referred to as aggregates, can vary in size considerably, but in general are larger than about 500 nm and are made up of a subset of particles, i.e., primary particles. Throughout this disclosure, the terms "particle" or "particles" are generic terms that can include any size particles. Sub-particles can include one or more type of structure (e.g., crystal structure, defect concentration, etc.), and one or more type of atom. The sub-particles can be any shape, including but not limited to spherical shapes, spheroidal shapes, dumbbell shapes, cylindrical shapes, elongated cylindrical type shapes, rectangular prism shapes, disk shapes, wire shapes, irregular shapes, dense shapes (i.e., with few voids), porous shapes (i.e., with many voids), etc.

Microwave Reactors

Methods of the present embodiments utilize unique plasma reactors that enable creation of carbon particles, modification of the carbon particles to be resin-compatible and combining the carbon with the resin—all within the same reactor during the process in which the carbon particles are created. Although embodiments shall be described using microwave energy as an example, the present disclosure applies generally to high-frequency plasma reactors that utilize radiofrequency, along with bands such as very high frequency (VHF, 30 MHz to 300 MHz), ultra-high frequency (UHF, 300 MHz to 3 GHz), or microwave frequency (e.g., 915 MHz or above, such as 2.45 GHz, or 5.8 GHz). Furthermore, although embodiments shall primarily be described in terms of plasma reactors, the present methods may include the use of other reactor technologies (e.g., thermal reactors) in conjunction with the plasma reactors.

In some embodiments, the present carbon materials are produced using microwave plasma reactors and/or methods as described in U.S. Pat. No. 9,812,295, entitled "Microwave Chemical Processing," or in U.S. Pat. No. 9,767,992, entitled "Microwave Chemical Processing Reactor," which are assigned to the same assignee as the present application, and are incorporated herein by reference as if fully set forth herein for all purposes.

In some embodiments, microwave plasma chemical processing of process materials (e.g., hydrocarbon gases, or liquid mixtures) is used to produce the carbon particles, sub-particles (e.g., nanoparticles) and aggregates described herein. More specifically, microwave plasma chemical processing of precursor materials using various techniques, including pulsing of the microwave radiation to control the energy of the plasma, can be used to produce the carbon particles and sub-particles described herein. The ability to control the energy of the plasma enables the selection of one or more reaction pathways in conversion of the precursor materials into specific separated components. Pulsed microwave radiation can be used to control the energy of the plasma, because the short-lived high-energy species that are created when a plasma ignites can be re-generated at the start of each new pulse. The plasma energy is controlled to have a lower average ion energy than conventional techniques, but at a high enough level to enable the targeted chemical reactions to occur at high precursor material flows and high pressures. In some embodiments, a pressure within the waveguide is at least 0.1 atmosphere.

In some embodiments, the process material is a gas. In some embodiments, the process material is a hydrocarbon gas, such as $C_2H_2$, $C_2H_4$, $C_2H_6$. In some embodiments, the process material is methane, and the separated components are hydrogen and nanoparticulate carbon. In some embodiments, the process material is carbon dioxide with water, and the separated components are oxygen, carbon and water.

The microwave reactors used in the present embodiments may utilize a "field-enhancing waveguide" (FEWG), which refers to a waveguide with a first cross-sectional area and a second cross-sectional area, where the second cross-sectional area is smaller than the first cross-sectional area and is farther away from the microwave energy source than the first cross-sectional area. The decrease in cross-sectional area enhances the field by concentrating the microwave energy, with the dimensions of the waveguide being set to maintain propagation of the specific microwave frequency being used. The second cross-sectional area of the FEWG extends along a reaction length that forms the reaction zone of the FEWG. There is a field-enhancing zone between the first cross-sectional area and the second cross-sectional area of a FEWG. That is, in some embodiments, the field-enhancing zone of the FEWG has a decreasing cross-sectional area between a first cross-sectional area and a second cross-sectional area of the field-enhancing waveguide, where the second cross-sectional area is smaller than the first cross-sectional area. A reaction zone is formed by the second cross-sectional area extending along a reaction length of the field-enhancing waveguide. A microwave energy source is coupled to the field-enhancing waveguide and provides microwave energy into the first cross-sectional area of the field-enhancing zone, where the microwave energy propagates in a direction along the reaction length of the reaction zone. The microwave plasma reactor is absent of a dielectric barrier between the field-enhancing zone and the reaction zone.

Figure 1B:
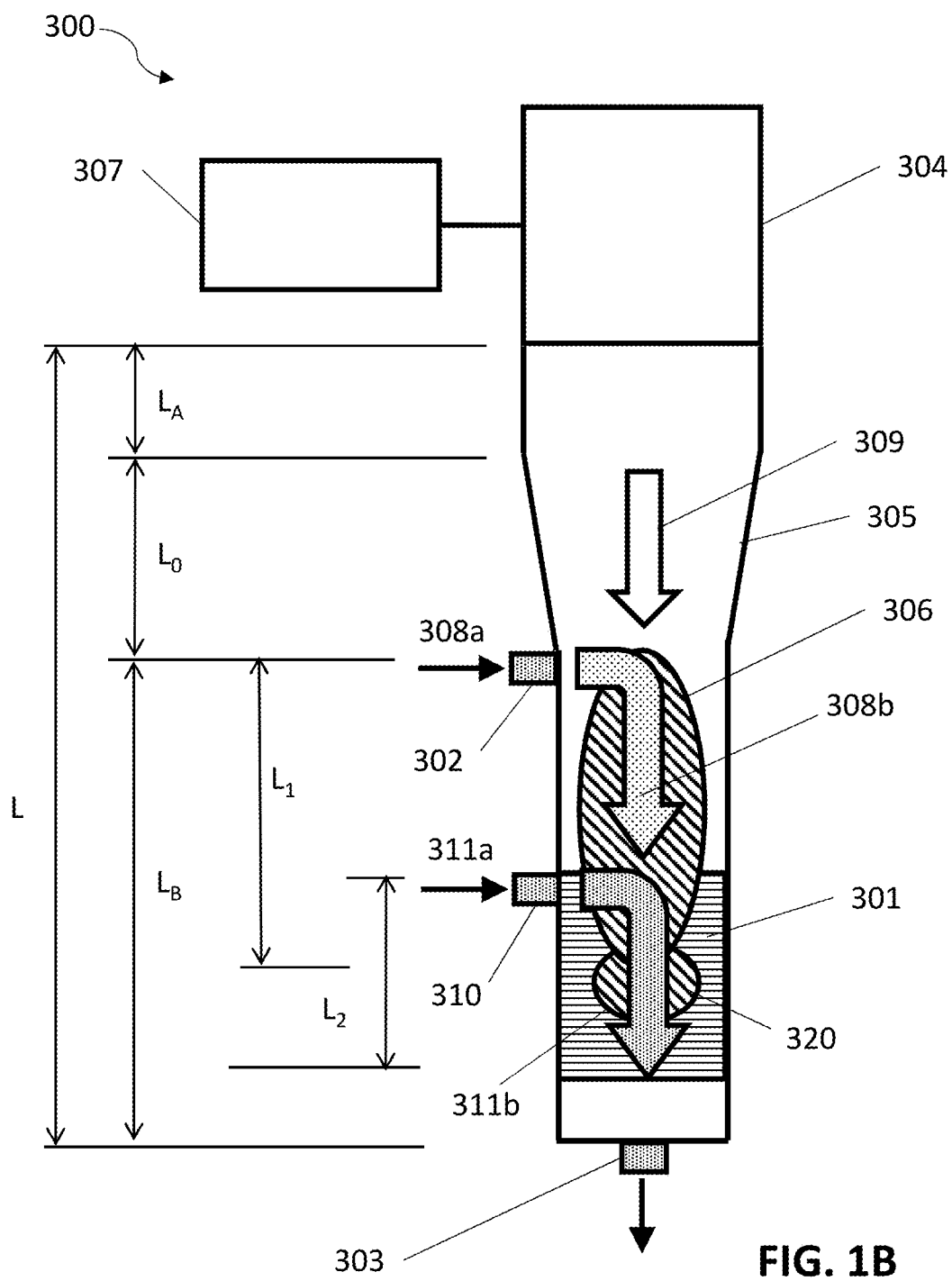

FIGS. 1A and 1B show embodiments of microwave chemical processing systems of the present disclosure, in which a FEWG is coupled to a microwave energy generator (i.e., a microwave energy source), a plasma is generated from a supply gas in a plasma zone of the FEWG, and a reaction length of the FEWG serves as the reaction zone to separate the process material into separate components. The present reactors as demonstrated by FIGS. 1A and 1B are absent of a dielectric barrier between the field-enhancing zone of the field-enhancing waveguide and the reaction zone. The absence of a dielectric barrier in the present reactors beneficially allows microwave energy to be directly transferred to the input materials (e.g., hydrocarbon gases) that are being processed, enabling higher processing temperatures (e.g., 3000 K and above)—and in particular, very high localized temperatures (e.g., 10,000 K and above)—than conventional reactors. In contrast, the reaction zones of conventional systems are enclosed within a dielectric barrier such as a quartz chamber. Consequently, the microwave energy is used for indirect heating, being used to ionize a carrier gas into a plasma, but the microwave energy itself is not transmitted through the barrier. The direction of propagation of the microwave energy is parallel to the majority of the flow of the supply gas and/or the process material, and the microwave energy enters the waveguide upstream of the portion of the FEWG where the separated components are generated.

As shown in FIG. 1A, a microwave chemical processing reactor 200, in accordance with some embodiments, generally includes a FEWG 205, one or more inlets 202 configured to receive supply gas and/or process material 208a flowing into the FEWG 205, and a microwave energy source 204 that is coupled to the FEWG 205, among other elements not shown for simplicity.

In some embodiments, microwave circuit 207 controls a pulsing frequency at which microwave energy 209 from microwave energy source 204 is pulsed. In some embodiments, the microwave energy 209 from microwave energy source 204 is continuous wave.

The FEWG 205 has a length L. The portion of the FEWG 205 with length $L_A$ (shown in FIGS. 1A and FIG. 1B) is closer to the microwave energy generator than the portion of the FEWG with length $L_B$ (shown in FIGS. 1A and FIG. 1B). Throughout this disclosure, different portions of the FEWG will be described by a capital L with a subscript denoting the certain portion of the FEWG (e.g., $L_A$, $L_0$, $L_B$, $L_1$, $L_2$), and synonymously, the lengths of the different portions of the FEWG will also be described by a capital L with a subscript denoting the length of a certain portion of the FEWG (e.g., $L_A$, $L_0$, $L_B$, $L_1$, $L_2$).

The cross-sectional area of the FEWG in length $L_B$ is smaller than the cross-sectional area of the FEWG in length $L_A$. The length of the FEWG $L_0$ is located between lengths $L_A$ and $L_B$ of the FEWG and has a decreasing cross-sectional area along the path of the microwave energy propagation. In some embodiments, the cross-sectional area of the FEWG along length $L_0$ decreases in a continuous manner. In some embodiments, the cross-sectional area of the FEWG along length $L_0$ decreases linearly between lengths $L_A$ and $L_B$. In some embodiments, the cross-sectional area of the FEWG along length $L_0$ decreases non-linearly between lengths $L_A$ and $L_B$, such as decreasing parabolically, hyberbolically, exponentially or logarithmically. In some embodiments, the cross-sectional area of the FEWG along length $L_0$ decreases in a or an abrupt manner between lengths $L_A$ and $L_B$, such as decreasing through one or more discrete steps. The decrease in cross-sectional area serves to concentrate the electric field, thus increasing the microwave energy density while still providing a significant amount of area in which plasma can be formed compared to conventional systems. The portion of the FEWG with length $L_B$ (shown in FIGS. 1A and FIG. 1B) may have a rectangular cross-section of dimensions 0.75 inches by 3.4 inches when using a microwave energy frequency of 2.45 GHz. This cross-sectional area is much greater than conventional systems where the plasma generation area is generally less than one square inch. The dimensions of the different portions of the FEWG 205 are set according to the microwave frequency, in order to properly function as a waveguide. For example, for an elliptical waveguide the cross-sectional dimensions can be 5.02 inches by 2.83 inches for 2.1-2.7 GHz.

In conventional gas processing systems, the limited region in which plasma can form, such as less than one square inch as described above, constrains the volume in which gas reactions can occur. Also, in conventional systems the microwave energy enters the reaction chamber through a window (typically quartz). In these systems, dielectric materials (e.g., particulate carbon) are coated on the window during processing leading to a decreased power delivery over time. This can be highly problematic if these separated components absorb microwave energy because they can prevent the microwave energy from coupling into the reaction chamber to generate the plasma. Consequently, a rapid build-up of by-products, such as carbon particles that are produced from the gas reactions, occurs and limits the run-time of the processing equipment. In the present embodiments, the system 200 and system 300 (FIG. 1B) are designed without the use of a window in the reaction zone; that is, using a parallel propagation/gas flow system where the energy enters upstream from the reaction. As a result, more energy and power can be coupled into the plasma from the microwave energy source, enabling higher processing temperatures of hydrocarbon input materials. The lack of a window and the greater volume within the waveguide 205, compared to limited reaction chamber volumes in conventional systems, greatly reduces the issue of particle build-up causing limited run-times, thus improving production efficiency of the microwave processing system.

The microwave energy 209 in FIG. 1A creates a microwave plasma 206 in the supply gas and/or process material within a plasma zone with length $L_1$ (shown in FIGS. 1A-1B) of the length of the FEWG 205. The microwave energy 209 may also propagate into the reaction zone to directly interact with the process material flow 208b. The plasma zone with length $L_1$ is located within the portion of the FEWG $L_B$, where the cross-sectional area is smaller and the microwave energy density is higher than in length $L_A$. In some embodiments, a supply gas that is different from the process material is used to generate the microwave plasma 206. The supply gas may be, for example, hydrogen, helium, a noble gas such as argon, or mixtures of more than one type of gas. In other embodiments, the supply gas is the same as the process material, where the process material is the material from which separated components are being created.

In some embodiments, the supply gas and/or process material inlet 202 is located upstream from the portion of the FEWG $L_B$, or is located within the portion of the FEWG $L_0$, or is located within the portion of the FEWG $L_A$, or is located upstream of the portion of the FEWG $L_A$. In some embodiments, the portion of the FEWG $L_1$ extends from a position along the FEWG downstream from the position where the supply gas and/or process material 208a enters the FEWG, to the end of the FEWG or to a position between the entrance of the supply gas and/or process material and the end of the FEWG 205. In some embodiments, the portion of the FEWG $L_1$ extends from where the supply gas and/or process material 208a enters the FEWG, to the end of the FEWG or to a position between the entrance of the supply gas and/or process material and the end of the FEWG.

The generated plasma 206 provides energy for reactions to occur in process material 208b within a reaction zone 201 of the FEWG 205 having a reaction length $L_2$. In some embodiments, reaction zone $L_2$ extends from where the process material 208a enters the FEWG 205, to the end of the FEWG 205 or to a position between the entrance of the process material and the end of the FEWG 205. Given the right conditions, the energy in the plasma 206 will be sufficient to form separated components from the process material molecules. Additional hydrocarbon cracking reactions and/or modifications of produced carbon materials may occur in high temperature plume 220, which may also be referred to as a plasma afterglow. In some embodiments, further input materials may be introduced into the reactor at inlet 202. For example, elements may be introduced during or just after producing the carbon materials in order to functionalize the carbon materials (e.g., to enhance bonding with a resin) or to add resins (e.g., bond, embed) to the carbon materials. One or more outlets 203 are configured to collect the separated products out of the FEWG 205 downstream of the reaction zone portion 201 of the FEWG where reactions occur in the process material 208b. In the example shown in FIG. 1A, the propagation direction of the microwave energy 209 is parallel with the majority of the supply gas and/or process material flow 208b, and the microwave energy 209 enters the FEWG 205 upstream of the reaction zone 201 of the FEWG where the separated components are generated.

In some embodiments, a pressure barrier 210 that is transparent to microwave energy can be located within the microwave energy source 204, near the outlet of the microwave energy source, or at other locations between the microwave energy source 204 and the plasma 206 produced in the FEWG. This pressure barrier 210 can serve as a safety measure to protect from potential backflow of plasma into the microwave energy source 204. Plasma does not form at the pressure barrier itself; instead, the pressure barrier is simply a mechanical barrier. Some examples of materials that the pressure barrier can be made of are quartz, ethylene tetrafluoroethylene (ETFE), other plastics, or ceramics. In some embodiments, there can be two pressure barriers 210 and 211, where one or both pressure barriers 210 and 211 are within the microwave energy source 204, near the outlet of the microwave energy source, or at other locations between the microwave energy source 204 and the plasma 206 produced in the FEWG. In some embodiments, the pressure barrier 211 is closer to the plasma 206 in the FEWG than the pressure barrier 210, and there is a pressure blowout port 212 between the pressure barriers 210 and 211 in case the pressure barrier 211 fails.

In some embodiments, a plasma backstop (not shown) is included in the system to prevent the plasma from propagating to the microwave energy source 204 or the supply gas and/or process material inlet(s) 202. In some embodiments, the plasma backstop is a ceramic or metallic filter with holes to allow the microwave energy to pass through the plasma backstop, but preventing the majority of the plasma species from passing through. In some embodiments, the majority of the plasma species will be unable to pass the plasma backstop because the holes will have a high aspect ratio, and the plasma species will recombine when they hit the sidewalls of the holes. In some embodiments, the plasma backstop is located between portion $L_0$ and $L_1$, or within portion $L_0$ upstream of portion $L_1$ and downstream of the inlet(s) 202 (in an embodiment where inlet 202 is within portion $L_0$) and the microwave energy source 204.

FIG. 1B shows another embodiment of a microwave chemical processing system 300 in which a supply gas and a process material are injected at different locations. The microwave chemical processing system 300, in accordance with some embodiments, generally includes a FEWG 305, one or more supply gas inlets 302 configured to receive supply gas 308a flowing into the FEWG 305, one or more process material inlets 310 configured to receive process material 311a, and a source of microwave energy 304 that is coupled to the FEWG 305, among other elements not shown for simplicity. The location of process material inlet 310 is downstream of the location of supply gas inlet 302, where downstream is defined in a direction of the microwave energy propagation.

In some embodiments, microwave circuit 307 controls a pulsing frequency at which microwave energy 309 from microwave energy source 304 is pulsed. In some embodiments, the microwave energy from microwave energy source 304 is continuous wave.

The microwave energy 309 creates a microwave plasma 306 in the supply gas 308b within a plasma zone $L_1$ of the length L of the FEWG 305. In some embodiments, portion $L_1$ extends from a position along the FEWG 305 downstream from the position where the supply gas 308a enters the FEWG 305, to the end of the FEWG 305 or to a position between the entrance of the supply gas and the end of the FEWG 305. In some embodiments, portion $L_1$ extends from where the supply gas 308a enters the FEWG 305, to the end of the FEWG 305 or to a position between the entrance of the supply gas and the end of the FEWG 305. One or more additional process material inlets 310 are configured to receive process material flowing into the FEWG at a second set of locations downstream of the supply gas inlet(s) 302. The generated plasma 306 provides energy for reactions to occur within the reaction zone 301 of the FEWG 305 having a reaction length $L_2$. In some embodiments, portion $L_2$ extends from where the process material 311a enters the FEWG 305, to the end of the FEWG 305 or to a position between the entrance of the process material and the end of the FEWG 305. Given the right conditions, the energy in the plasma will be sufficient to form separated components from the process material molecules. Additional hydrocarbon cracking reactions and/or modifications of produced carbon materials may occur in high temperature plume 320. In some embodiments, further input materials may be introduced into the reactor at process material inlet 310. For example, elements may be introduced during or just after producing the carbon materials in order to functionalize the carbon materials (e.g., to enhance bonding with a resin) or to add resins (e.g., bond, embed) to the carbon materials. One or more outlets 303 are configured to collect the separated products out of the FEWG 305 downstream of the portion 301 where reactions occur. In the example system 300 shown in FIG. 3, the propagation direction of the microwave energy 309 is parallel with the majority of the supply gas flow 308b and the process material flow 311b, and the microwave energy 309 enters the FEWG 305 upstream of the reaction portion 301 of the FEWG where the separated components are generated.

In some embodiments, the FEWG (e.g., 205 in FIG. 1A, and 305 in FIG. 1B) is configured to maintain a pressure from 0.1 atm to 10 atm, or from 0.5 atm to 10 atm, or from 0.9 atm to 10 atm, or greater than 0.1 atm, or greater than 0.5 atm, or greater than 0.9 atm. In many conventional systems, the microwave chemical processing is operated at vacuum. However, in the present embodiments with the plasma being generated within the FEWG, operating in a positive pressure environment assists in preventing the generated plasma from feeding back into the microwave energy source (e.g., 204 in FIG. 1A, and 304 in FIG. 1B).

The FEWG (e.g., 205 in FIG. 1A, and 305 in FIG. 1B) may have a rectangular cross-section within length $L_B$ of dimensions 0.75 inches by 3.4 inches, to correspond to a microwave energy frequency of 2.45 GHz. Other dimensions of $L_B$ are possible for other microwave frequencies, and dependent upon waveguide mode these cross-sectional dimensions can be from 3-6 inches. The FEWG (e.g., 205 in FIG. 1A, and 305 in FIG. 1B) may have a rectangular cross-section within length $L_A$ of dimensions 1.7 inches by 3.4 inches, for example, to correspond to a microwave energy frequency of 2.45 GHz. Other dimensions of $L_A$ are possible for other microwave frequencies. Notably, the FEWG serves as the chamber in which the plasma is generated and the process material reactions to occur, rather than having a separate waveguide and quartz reaction chamber as in conventional systems. Having the FEWG serve as the reactor chamber provides a much larger volume in which gas reactions can occur (e.g., up to 1000 L). This enables high flow rates of process material to be processed, without being limited by a build-up of carbon particulate as occurs in conventional systems. For example, process material flow rates through the inlet (e.g., 202 in FIG. 1A, and 310 in FIG. 1B) into the waveguide (e.g., 205 in FIG. 1A, and 305 in FIG. 1B) may be from 1 slm (standard liters per minute) to 1000 slm, or from 2 slm to 1000 slm, or from 5 slm to 1000 slm, or greater than 1 slm, or greater than 2 slm, or greater than 5 slm. Supply gas flow rates through the inlet (e.g., 202 in FIG. 1A, and 302 in FIG. 1B) into the waveguide (e.g., 205 in FIG. 1A, and 305 in FIG. 1B) may be, for example, from 1 slm to 1000 slm, or from 2 slm to 1000 slm, or from 5 slm to 1000 slm, or greater than 1 slm, or greater than 2 slm, or greater than 5 slm. Dependent upon the gas plasma properties that result in sufficient plasma density (e.g., secondary electron emission coefficient) the flows can be from 1 slm to 1000 slm and with pressures up to 14 atm.

In some embodiments, multiple FEWGs may be coupled to one or more energy sources (e.g., microwave energy sources). The FEWGs in these embodiments can share some or all of the features of the systems described above. The supply gas and process material inputs in these embodiments can also share some or all of the features described above. In some embodiments, each FEWG has a reaction zone. In some embodiments, a plasma is generated from a supply gas in a plasma zone in each of the FEWGs, and a reaction length of each of the FEWGs serve as reaction zones to separate the process material into separate components. In some embodiments, the reaction zones are connected together, and the microwave chemical processing system has one outlet for the separated components. In some embodiments, the reaction zones are connected together, and the microwave chemical processing system has more than one outlet for the separated components. In some embodiments, each reaction zone has its own outlet for the separated components. Multi-chamber reactors in some embodiments may allow for carbon materials to be produced and modified without additional processing, and/or to be directly input into a resin/polymer. Other examples of multi-component (e.g., multiple reaction zones, multiple energy sources) are described in the aforementioned U.S. Pat. No. 9,767,992.

3D Carbon Structures

Figure 2:
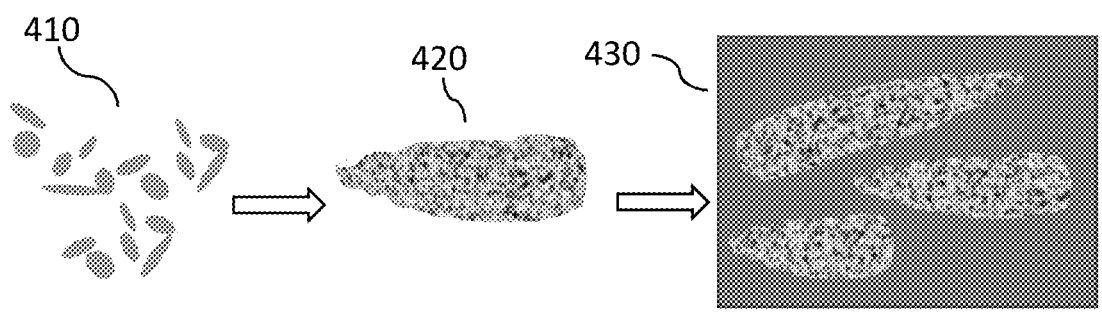
FIG. 2 is a schematic of forming a composite with graphene nanoplatelets, as known in the art.

The present composite materials and methods include creation of high surface area 3D carbon materials that include pore matrix structures (e.g., voids or open spaces within and around sub-particles of a carbon particle) for incorporation into composite materials for strength and conductivity. Using graphene as an example type of carbon, conventional graphite or two-dimensional (2D) graphene nanoplatelet (GNP) materials are typically elongated shapes that have a planar surface and are on the order of 200 μm long. To form a conventional composite with GNPs as shown in the schematic of FIG. 2, the GNPs 410 are encased in a first resin to form particles 420, the particles 420 are dried, and then the particles 420 are added into a second resin to form a composite 430. Thus, in these conventional GNP-resin composites the GNPs are simply encased in the first resin, and the strength of the composite 430 is typically limited by the resin-to-resin bonds between the first resin that is used to form particles 420 and the second resin into which the particles 420 are dispersed. Conventional GNP composites (i.e., without functionalized GNP) typically cannot be strengthened without affecting the elastic modulus, and delamination often occurs since the GNPs are not chemically attached to each other or to the bulk resin.

In contrast, 3D carbon structures, such as 3D graphene structures, of the present methods and materials have an innately 3D-connected matrix that form longer-range materials acting as 3D robust structures, adding strength in three dimensions. The 3D carbon structures enable polymer to penetrate into a pore matrix of the structure, providing mechanical interlocking between the carbon and polymer through both the geometry of the structures and high surface area. The 3D carbons may also be functionalized, as shall be described in more detail subsequently, promoting chemical connections through carbon-to-resin bonds. Additionally, composites formed from the 3D carbon materials can provide independent control of strength and modulus by tailoring geometry of the 3D structure of the carbons.

Figure 3A:
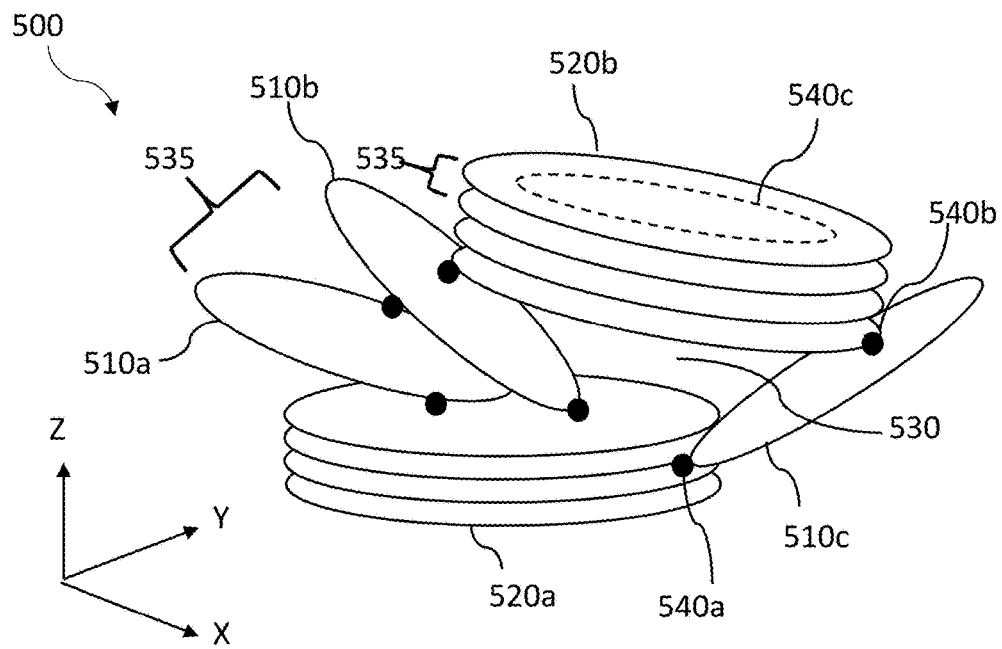
FIG. 3A is a schematic diagram of a 3D graphene particle, in accordance with some embodiments.

FIG. 3A is a schematic diagram of a carbon particle 500 which is a 3D graphene particle according to some embodiments. Unlike other 3D forms of carbon materials, the unique structure of the present plasma-created 3D carbon materials (e.g., graphene nanoplatelets) is structured as a pore matrix. The 3D graphene particles may include graphene nanoplatelet sub-particles, where the sub-particles are in the form of single layer graphene (SLG) sub-particles, few layer graphene (FLG) sub-particles and/or many layer graphene (MLG) sub-particles. The carbon particle 500 is illustrated with SLG sub-particles 510a, 510b, 510c and FLG sub-particles 520a, 520b. The 3D graphenes of the present disclosure may contain only one form of graphene, such as only SLG, FLG, or MLG, or may be a combination of one or more forms, such as SLG and FLG or SLG and MLG. In some embodiments, the 3D graphene may be predominantly FLG, such as greater than 50%, or greater than 70%, or greater than 90% FLG sub-particles in the carbon particle 500. In some embodiments, the 3D graphene may be predominantly MLG or SLG, such as greater than 50%, or greater than 70%, or greater than 90% of MLG or SLG sub-particles in the carbon particle 500. Although the particle 500 is shown with only GNPs, the carbon particles of the present disclosure may include other allotropes of carbon such as, but not limited to, CNOs, CNTs and nanowires.

The graphene nanoplatelet sub-particles form a pore matrix by being grown and connected 3-dimensionally. That is, the 3D graphene particle 500 grows in an X-Y plane as well as Z-direction, where SLG sub-particles 510a, 510b and 510c and FLG sub-particles 520a and 520b grow at various angles relative to each other during formation of the sub-particles, such as orthogonally and at acute angles. For example, FLG sub-particle 520a may be formed first during hydrocarbon cracking, then SLG sub-particles 510a, 510b and 510c may be grown from edge and/or basal plane locations of FLG sub-particle 520a. FLG sub-particle 520a has graphene layers with growth primarily oriented in the X-Y plane, while SLG sub-particles 510a, 510b and 510c are grown with their basal planes oriented out of the X-Y plane and into the Z-direction. Consequently, the overall growth of graphene particle 500 is in the X-Y plane as well as in the Z-direction. The various sub-particles of particle 500 are interconnected in a variety of edge and basal (planar surface) locations, where the connections 540a, 540b and 540c may be carbon-carbon bonds due to the connections being formed during formation of the graphene sub-particles. Connection 540a is in an edge-to-edge location between an edge of FLG sub-particle 520a and an edge of SLG sub-particle 510c, while connection 540b is in an edge-to-basal plane location between an edge of FLG sub-particle 520b and a basal plane of SLG sub-particle 510c. Connection 540c is in a basal plane-to-basal plane location between graphene nanoplatelet layers of FLG sub-particle 520b. These connections between sub-particles provide a pore matrix in a 3D manner that is beneficial for incorporation into composite materials. The connections between sub-particles may be, for example, through covalent or non-covalent bonds between the carbon lattices of two or more sub-particles, such as through the growth of one sub-particle that is initiated from a site in another sub-particle. The 3D graphene structure may also include curling, wrinkling or folding of the nanoplatelets, where these features are retained as three-dimensional geometries due to interconnections with surrounding sub-particles.

Figure 3B:
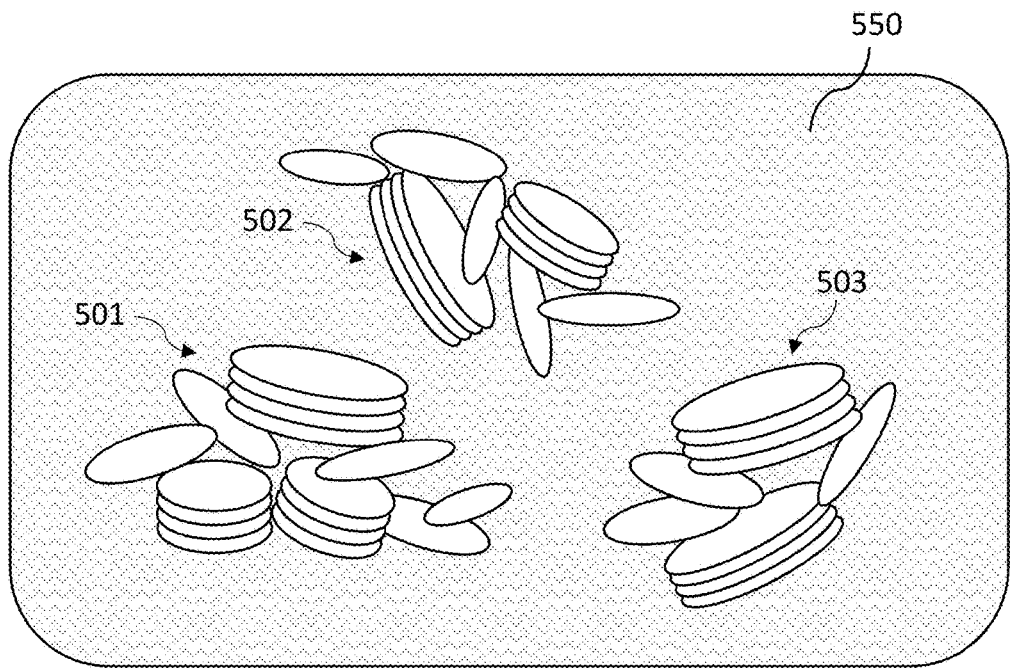
FIG. 3B is a schematic of a composite material of 3D graphene and resin, in accordance with some embodiments.

FIG. 3B shows 3D graphene particles 501, 502 and 503 incorporated into a resin 550, according to some embodiments. The 3D graphene particles 501, 502 and 503 may be as-formed in a reactor or may be particles that have been reduced in size from a larger particle formed in a reactor. The particles 501, 502 and 503 are shown as being dispersed in the resin 550, which may be facilitated by bonding of the particles 501, 502 and 503 with the resin 550 through tailoring of the particles in the reactor (e.g., by functionalization and/or embedding the resin with the particle as shall be described elsewhere in this disclosure).

The 3D carbon structures of the present materials provide a pore matrix, serving as a scaffold structure into which resin can permeate and interlock. The pores may be between sub-particles as indicated by pore 530 or may be between layers of MLG or FLG as indicated by pores 535. Pores of the present 3D carbon materials may also be referred to as openings, holes, or recesses into which resin can penetrate and entangle with the carbon particles, such as to increase the mechanical strength between the carbon additives and polymer. The pores also provide a high amount of surface area for the carbon to bond to the resin. In some embodiments, the pores may have a pore width of, for example, 1 nm to greater than 50 nm. The pores may be produced in bimodal or single mode, with very narrow pore widths. In some embodiments, the carbon particles have a mesoporous structure with a wide distribution of pore sizes (e.g., a multimodal distribution). For example, mesoporous particulate carbon can contain multimodal distribution of pores with sizes from 0.1 nm to 10 nm, from 10 nm to 100 nm, from 100 nm to 1 micron, and/or larger than 1 micron. For example, the pore structure can contain pores with a bimodal distribution of sizes, including smaller pores (e.g., with sizes from 1 nm to 4 nm) and larger pores (e.g., with sizes from 30 to 50 nm). Not to be limited by theory, such a bimodal distribution of pore sizes in a mesoporous carbon particle material can be beneficial in composite resin systems by enabling tuning of properties. For example, a greater amount of larger pores can be used to increase tensile strength, while a greater amount of smaller pores may be used to increase elastic modulus. In some cases, the void space distribution (i.e., pore size distribution) within the structures can be bimodal or multi-modal, and various modes of the distribution of pore sizes can be tailored to the end composite product to customize (e.g., maximize, minimize, or achieve a desired range of properties such as physical, mechanical, chemical and/or electrical properties). By way of a non-limiting example, the void spaces may comprise a significant percentage of larger void spaces (e.g., 50% or greater), where larger void spaces break up easier than smaller void spaces allowing for the materials to reinforce in different ways.

The present 3D carbon materials provide benefits over conventional carbon materials. For example, conventional 3D graphene may consist of crumpled graphene sheets.

Graphene sheets are typically desirable as the hexagonal carbon lattice structure is innately continuous along the plane of the sheets. Conventionally, graphene sheets are connected to each other from basal plane to basal plane, forming stacked layers where any gaps between layers of these long graphene sheets are likely to collapse. In contrast, connecting nanoplatelets together as in embodiments of the present 3D carbon materials is counterintuitive compared to a graphene sheet where the carbons are already connected. Yet, a 3D structure of graphene nanoplatelets connected at various locations provides a structure with a fixed open porosity in which the pores (i.e., gaps or openings into which resin can permeate and bond with) are not likely to collapse (i.e., be compressed or reduced in size). In addition, the connections between graphene layers and between sub-particles, in a variety of locations such as edge-to-edge, edge-to-basal plane and basal plane-to-basal plane, can provides larger pores than between stacked layers of essentially parallel sheets as in conventional graphenes.

Because carbon-to-carbon bonds connecting the sub-particles are formed during growth of the carbon particles (rather than non-carbon bonds between already-formed sub-particles, where the non-carbon bonds may also contain contaminants), properties such as electrical conductivity and thermal conductivity are improved in the present 3D carbon materials. Furthermore, in some embodiments the locations and numbers of 3D interconnections between sub-particles may customized to achieve certain characteristics. For example, having a combination of edge-to-edge, edge-to-basal plane and/or basal plane-to-basal plane connections may enable properties (e.g., electrical and/or thermal conductivity) to be multi-directional (i.e., X, Y and Z directions; 3-dimensional) instead of primarily in the X-Y plane as with conventional graphene sheets. This multi-directionality of properties may be useful in reducing the need to orient carbon materials within a composite material. Not to be limited by theory, edge-to-basal plane connections between GNPs may reduce the energy levels need for electrons to jump between GNPs. In one example, an edge-to-basal plane connection may enable an electron that is traveling on a basal plane of a first GNP to reroute around a naturally-occurring defect (e.g., vacancy) in the first GNP by jumping to a second GNP which is connected via a carbon-carbon bond at its edge to the basal plane of the first GNP. Thus, the 3D connections between GNPs enables electrons to be unconfined and travel out of the basal plane, resulting in a higher electrical conductivity than 2D electron flow paths of conventional platelets.

Figure 4A:
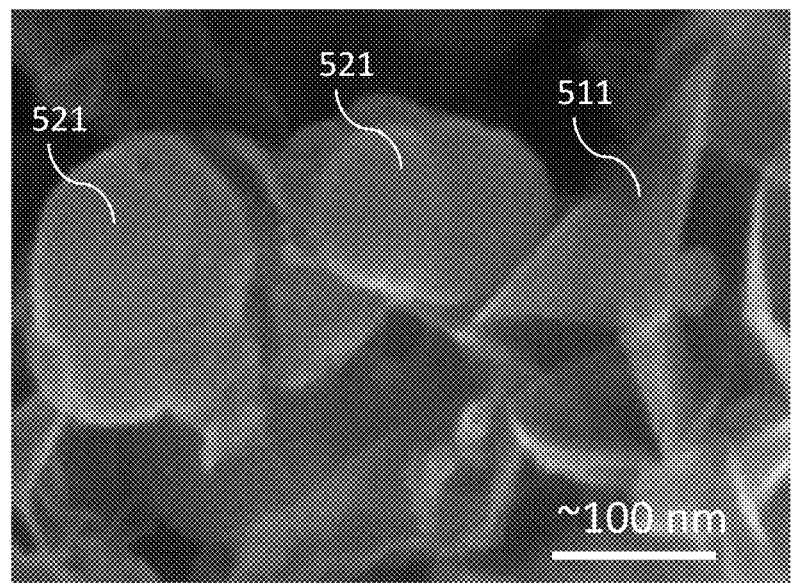
FIGS. 4A-4E are scanning electron microscope (SEM) images of carbon materials combined with resins, in accordance with some embodiments.
Figure 4B:
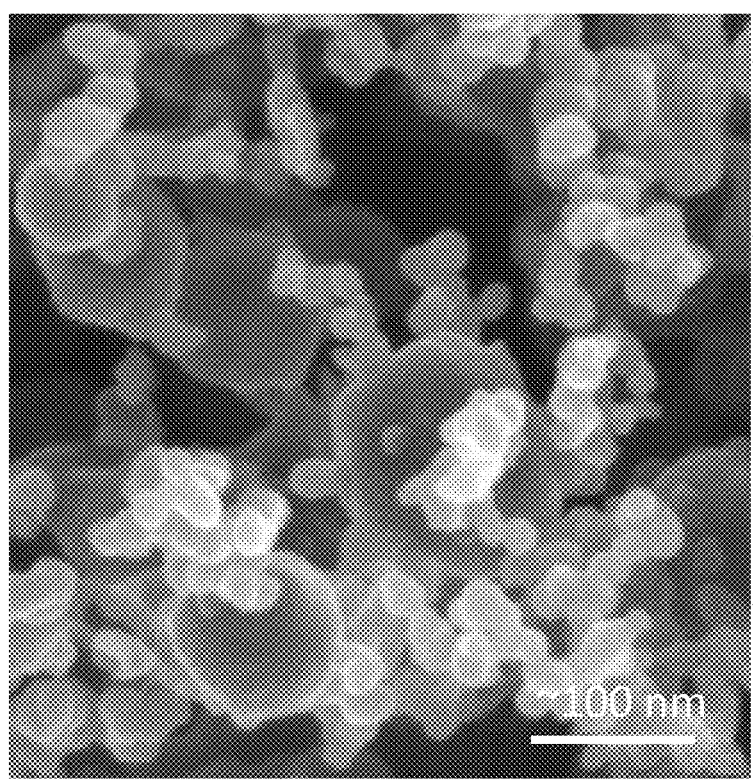

FIGS. 4A-4B are scanning electron microscope (SEM) images of examples of 3D graphene, according to some embodiments. FIG. 4A shows FLG sub-particles 521 and SLG sub-particle 511 that are interconnected in a 3D manner (X, Y and Z directions), where SLG sub-particle 511 is also curled in this image, providing additional 3D geometry. FIG. 4B shows interconnected GNPs of various sizes, demonstrating that a distribution of sub-particle sizes can be formed and utilized in carbon particle materials in some embodiments. FIG. 4B also demonstrates the ability to grow (i.e., seed) carbon-carbon growth of different kinds onto each other, such as different allotropes of carbon.

Figure 4C:
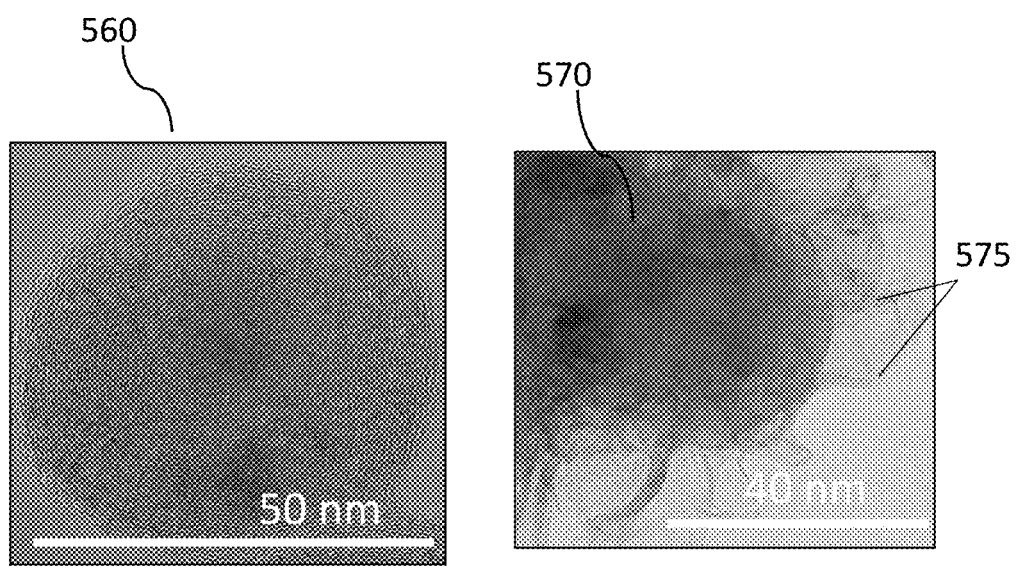

FIG. 4C shows examples of a multi-shell fullerene 560 and a multi-shell fullerene 570 with ligands 575, both of which may be incorporated into the present carbon materials individually or in combination in some embodiments. Ligands 575 are carbon strands grown from and extending from the multi-shell fullerene 570, with ligand lengths ranging from approximately 5-20 nm. Ligands 575 are an engineered feature that allows for different end-size carbons to be mixed within a resin. In one embodiment, the ligands 575 may break off (e.g., in engineered locations as shall be described later in this disclosure) when combined with a resin and may provide a reinforcement differently to the resin than larger-sized multi-shell fullerene balls. In another embodiment, the ligands 575 may be preserved such as to enable better anchoring into the polymer. Ligands 575 may provide benefits such as, for example, dispersion of energy and/or enabling a varied aspect ratio for improved bonding between the carbon and polymer.

Figure 4D:
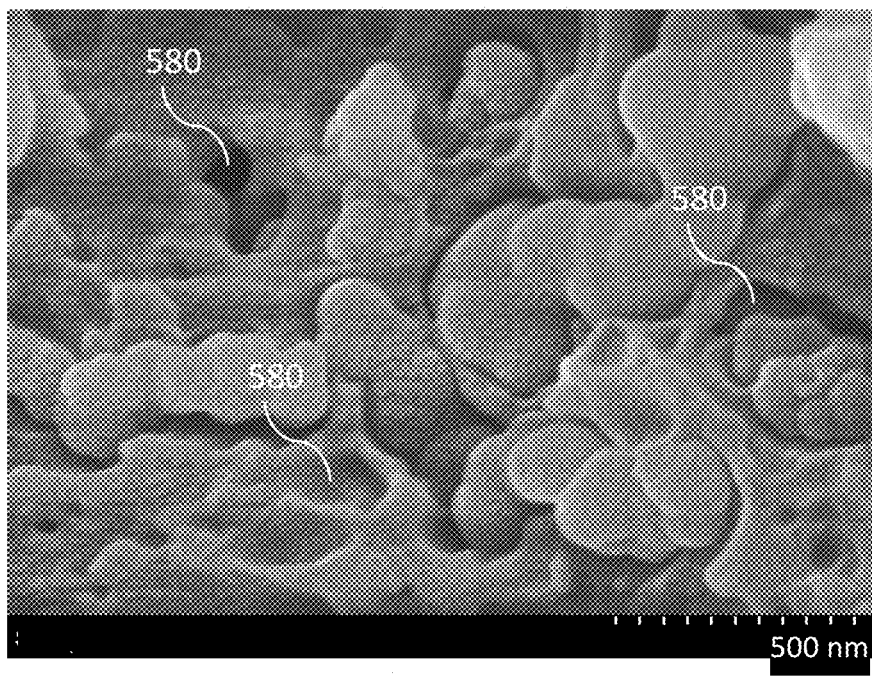
Figure 4E:
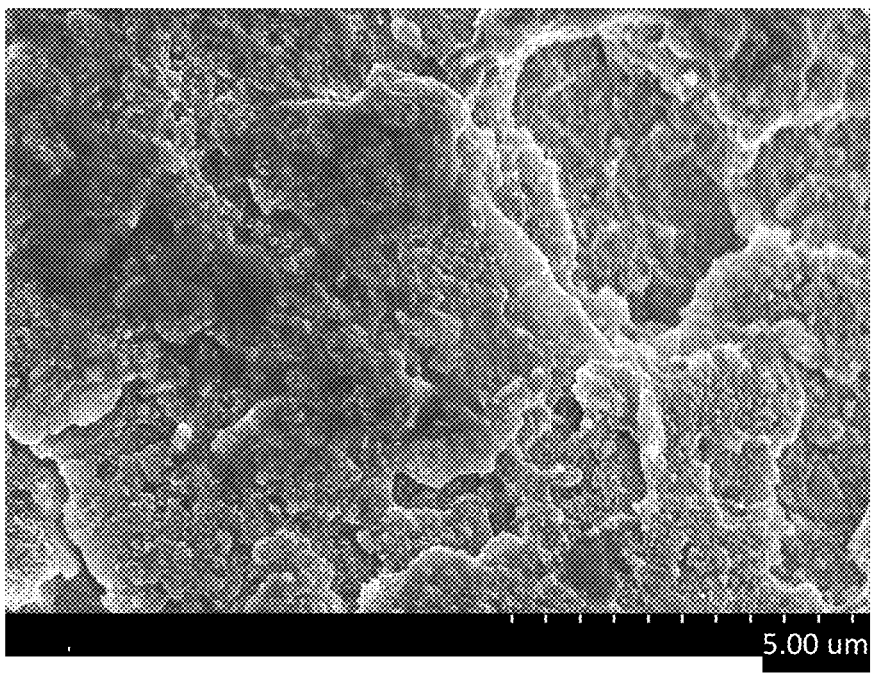

FIGS. 4D and 4E show example SEM images of carbon combined with resin, according to some embodiments. FIG. 4D shows a carbon-resin system that is partially wetted, to enable visualization of voids 580 (i.e., pores) in and around the carbon sub-particles and particles. FIG. 4E shows a more highly wetted carbon-resin system than FIG. 4D, demonstrating a high integration between carbon and resin that can be achieved in the present disclosure.

The 3D carbon structures of the present disclosure are made by plasma reactors as described herein that enable higher growth temperatures than conventional reactors. Because of the absence of a dielectric barrier between the high frequency energy source (e.g., microwave source) and reaction zone in the present embodiments, the high-frequency energy (e.g., microwave energy) is able to apply direct heating to the species to be cracked. In contrast, in conventional reactors the high-frequency energy is an indirect heating source since the energy is applied to a carrier gas that ionizes, and then the ionized gas is applied to the hydrocarbon materials. Growth temperatures in the hydrocarbon cracking processes of the present embodiments may be, for example, at least 3000 K with highly localized (e.g., at the atomic level) temperatures of, for example, greater than 10,000 K or greater than 20,000 K. These extremely high temperatures lead to rapid decomposition of hydrocarbon gases where highly controlled vapor growth allows for 3D formation of the carbon materials. Furthermore, the high growth temperatures of the present embodiments enable production of high phase purity carbon materials, such as greater than 95%, or greater than 97%, or greater than 99% phase purity of a particular phase, for example GNPs. Higher growth temperatures cause higher structure carbons (i.e., more crystalline) to be grown, whereas amorphous carbon is preferentially grown at low temperatures and has a low growth rate at these high temperatures. Consequently, the present plasma reactors and methods are uniquely able to produce carbon materials of high phase purity, with very little to no amorphous carbon being created. In one example of how carbon growth can be uniquely controlled in some embodiments, highly structured carbon materials may be grown in the highest temperature zone of a reactor, and then the highly structured carbon materials may be decorated with amorphous material in a lower temperature zone of the same or another reactor to aid in dispersion and/or promote a wettable surface along with favorable surface chemistry for the specific end polymer.

In addition to producing very pure fractions of highly structured carbon materials, the materials may be formed with 3D porous structures as described above. Formation of the 3D connections between sub-particles is made possible in the present reactors through control of process parameters that impact the growth rate of the carbon materials. One parameter that may be used to impact formation the 3D carbon particles of the present disclosure is partial pressure, where a decrease in the partial pressure of the process gas (e.g., methane content versus content of the supply gas that is used to create the plasma) may cause the process gas to come out of a supersaturated condition. That is, the partial pressure of the process gas can be controlled to create a metastable condition such that the hydrocarbon species emerges out of the plasma. Adjusting the partial pressure of the process gas to change this metastable condition can be used to affect the growth of carbon particles. For example, a slower growth rate may be used to create larger sized particles and sub-particles. Conversely, a faster growth rate may be used to create smaller sized particles and sub-particles, such as creating GNPs that are connectedly grown from each other instead of creating long graphene sheets. The size of the particles being created consequently affects characteristics of the carbon material, such as a density of the overall 3D carbon particle structure. In another example, the power level can also be controlled to impact the growth rate, such as by changing temperatures in the reactor. The present plasma reactor systems, through aspects such as extremely high temperatures and control of various process parameters, enable production of unique carbon particles having sub-particles connected in a 3D manner that form a porous structure.

Fibers

In some embodiments, the present composites include fibers as a reinforcing material in addition to the carbon additives (e.g., graphene, MWSF, 3D carbon materials, 3D graphene) that are combined with a resin. The fibers provide benefits such as serving as additional 3D structures on which 3D carbon materials can be formed, providing a 3D geometry matrix for composite materials, and providing a high aspect ratio material which enables beneficial properties for composite materials (e.g., high strength and/or anisotropic properties), Some embodiments of composites involve carbon fibers (which may be referred to as carbon composite filler (CCF)) combined with resin and carbon particles. Some embodiments of composites involve non-carbon fibers (i.e., non-carbon composite filler (non-CCF) such as fiberglass) combined with resin and carbon particles. Some embodiments of composite materials may utilize short chopped fibers added to resin and carbon particles. Types of fibers that may be used in some embodiments include, but are not limited to, carbon fibers, glass (Si), aramid, polyethylene, boron, ceramic, Kevlar or other spun or woven materials.

Figure 5A:
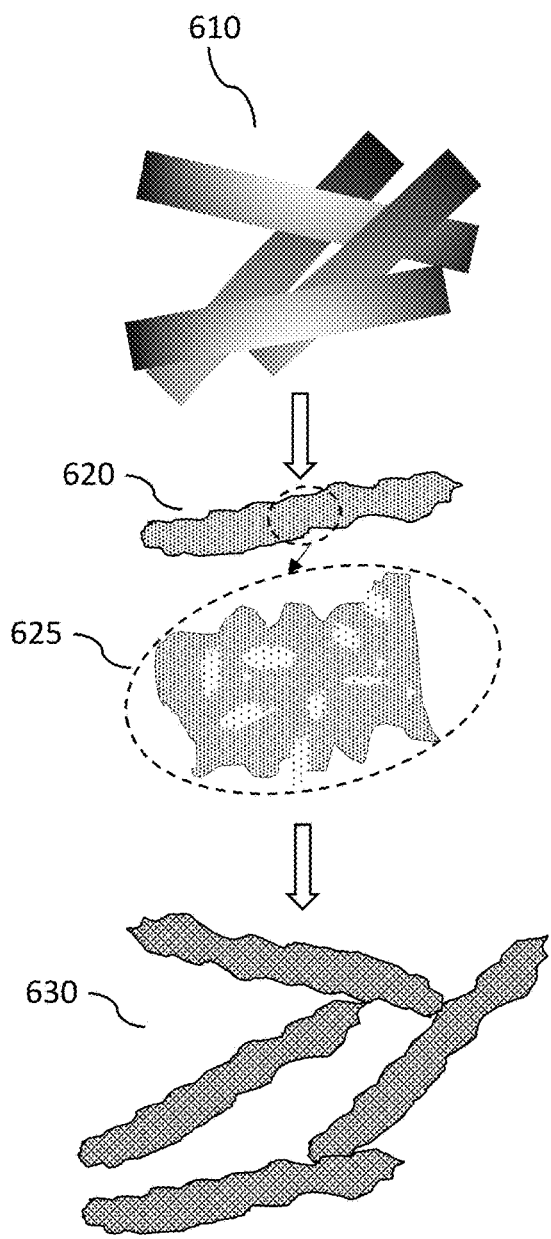
FIGS. 5A-5B are schematics of fibers for incorporation into carbon-resin composites, in accordance with some embodiments.

FIG. 5A is a diagram of unique materials processing involving fibers, according to some embodiments. Fibers 610 may be, for example, carbon, ceramic or metal fibers. In conventional composites, these fibers when combined with a resin binder will break away from the binder in the formed composite. In some embodiments of the present disclosure, the fibers 610 may be introduced into a reactor, which may or may not be the same reactor in which carbon particles are to be produced, and the fibers are modified, (e.g., etched chemically or non-chemically, or surface-treated to roughen or change the surface chemistry of the fibers) in the reactor as indicated by fibers 620. Detailed view 625 shows an embodiment in which etching causes surface roughening of the fibers. The modifying of the fibers may create a higher interfacial bonding between the fiber and polymer compared to an unmodified (e.g., unetched) fiber. For example, etching may be performed by adding oxygen-containing groups to a plasma zone of a reactor, where in some embodiments, a partial pressure of $O_2$ may be used, such as 0% to 21% or up to 100%. In a specific example, glass fibers may be etched using oxygen-containing groups, where Si—O—C bonds will be formed between resin and the glass fibers that are treated with $O_2$ and resin, or between carbon particles in the resin and the treated glass fibers.

Figure 5B:
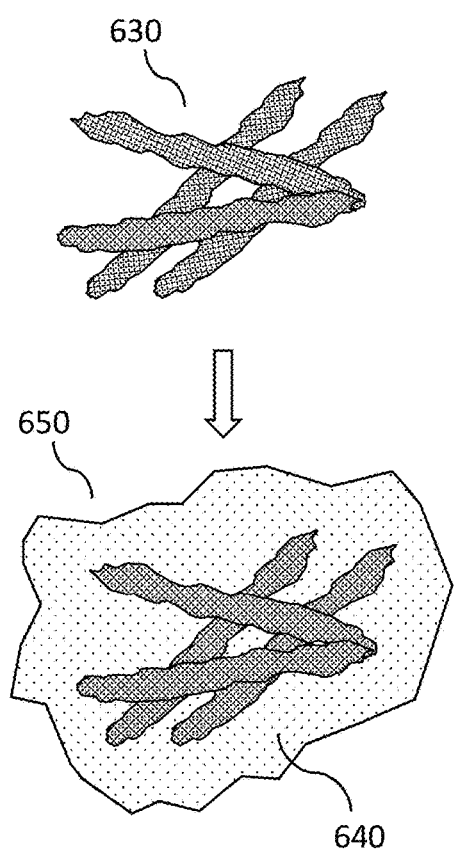

The modified fibers 630 are then used to form a composite material as illustrated in FIG. 5B, where the modified fibers 630 are added to a carbon-resin matrix 640 to form a composite material 650. The carbon-resin matrix 640 is a resin containing carbon filler particles, such as the 3D carbon materials disclosed herein. The resulting composite material 650 is an interconnected matrix of chemically bonded materials (fibers, carbon filler and resin) that provide improved properties such as higher strength than conventional resin-fiber composites.

Figure 6:
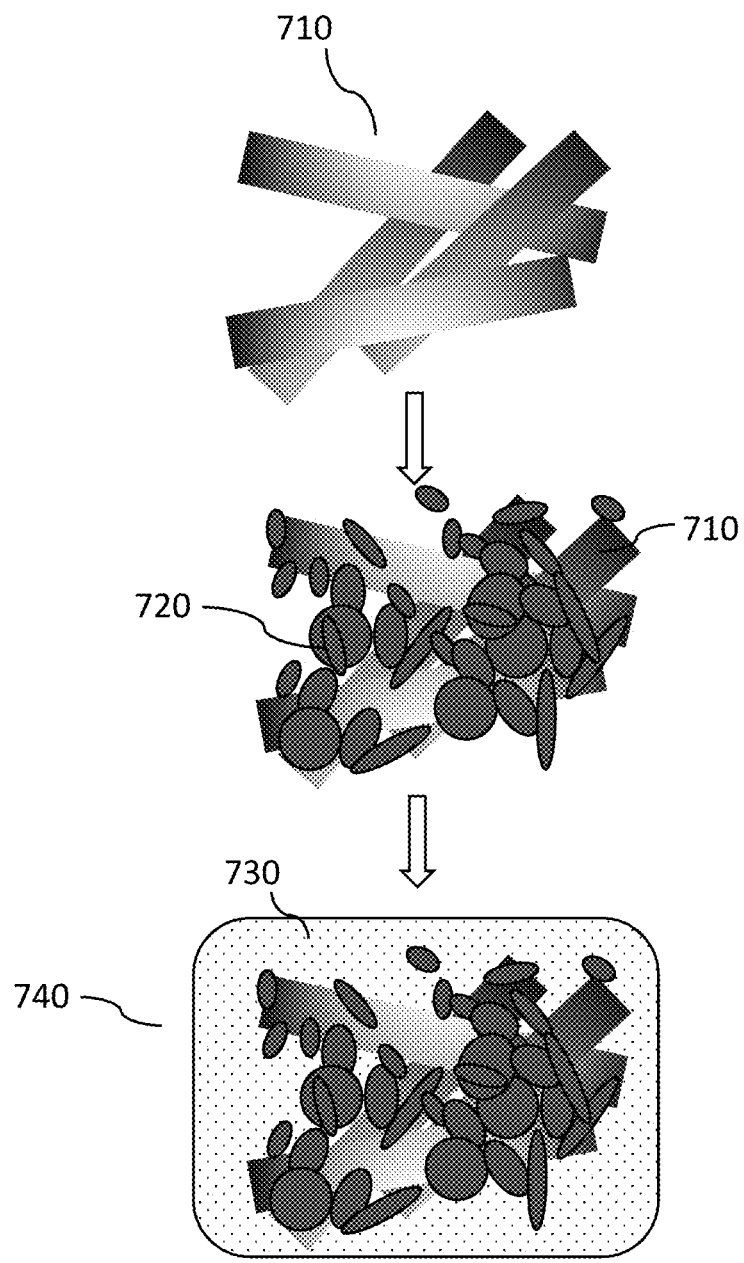
FIG. 6 is a schematic of carbon materials grown on fibers, in accordance with some embodiments.

In some embodiments, fibers are integrated with carbon materials to create synthesized carbon matrix materials to be added to a carbon-resin composite material. FIG. 6 illustrates incorporation of the present carbon materials, such as the 3D carbon structures described above, with fibers 710, in accordance with some embodiments. For example, the present composite materials and methods may include high surface area 3D carbon material 720 that are integrated with the fibers 710 during composite materials processing, such as in situ in a microwave reactor, to provide improved properties to composite materials such as strength and conductivity. The resulting 3D carbon materials on a 3D fiber structure provides high surface area and pores (e.g., between fibers, within the 3D carbon, and between fibers and 3D carbon) for mechanical interlocking and chemical bonding between a resin and the fiber-carbon structure. The fibers 710 may be various sizes in different embodiments, depending on the end-use application of the composite. For example, fibers may be nano- or macro-scale materials, or may be on the order of fractions of an inch or inches in size ranging from, for example, 0.1 inch to 2 inch fibers. The fibers may be on the order of 0.001" to 0.3" in diameter but are not limited to nanometer to micrometer sizes in diameter depending on the end manufacturing technique (i.e., injection molding, resin transfer molding, hand layup, etc.). In one example, the 3D carbon material 720 can be 3D graphene that is grown onto the fibers 710, creating an even higher reinforcement matrix for a composite material than 3D graphene particles alone. In some embodiments, fibers 710 are modified (e.g., etched) in the same reactor in which the 3D carbon material 720 is produced. In some embodiments, a microwave plasma reactor is used in concert with an etching gas to etch the fibers 710 within the plasma and thermal high temperature plume of the reactor to promote nucleation sites for carbon growth directly onto the fibers 710. The ionic energy within the plasma etches the fibers and drives the gas phase cracking process, which grows layers and three-dimensional structures of carbon material 720 onto the surfaces of the etched fibers. The usage of a base fiber material such as metallic, dielectric rods, and tubes, coated (either completely or partially) with carbon matrix structures, can beneficially produce reinforcing materials with tunable properties that enable the formation of composite materials with tuned materials properties. The synthesized 3D carbon materials that are deposited onto the 3D fibers are combined with a resin 730 to form the final composite material 740.

Figure 7A:
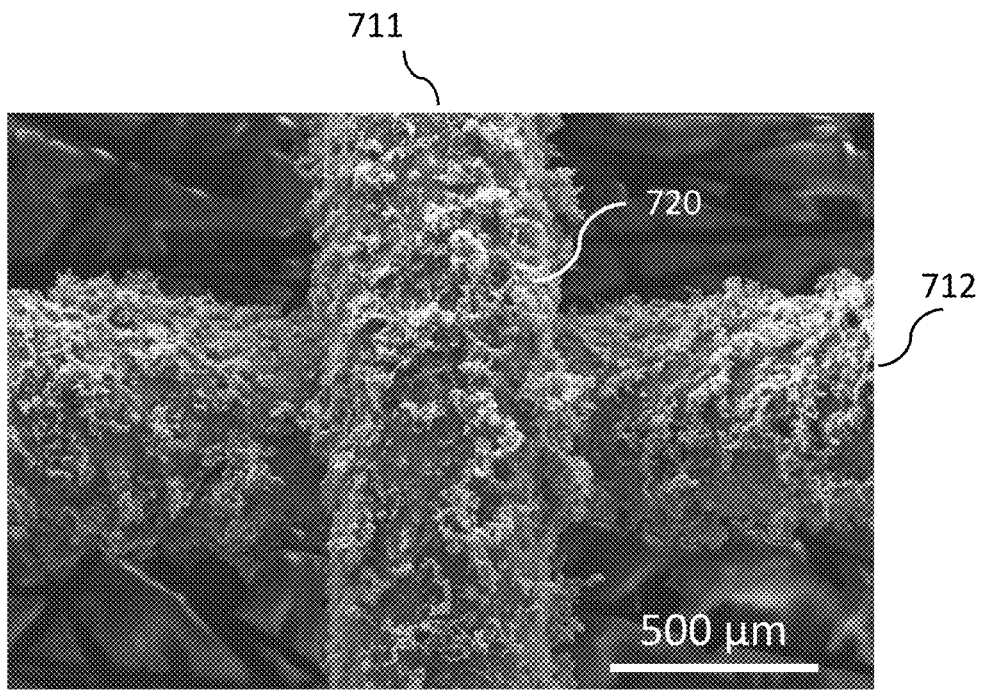
FIGS. 7A-7D are SEM images of carbon materials grown onto fibers, in accordance with some embodiments.
Figure 7B:
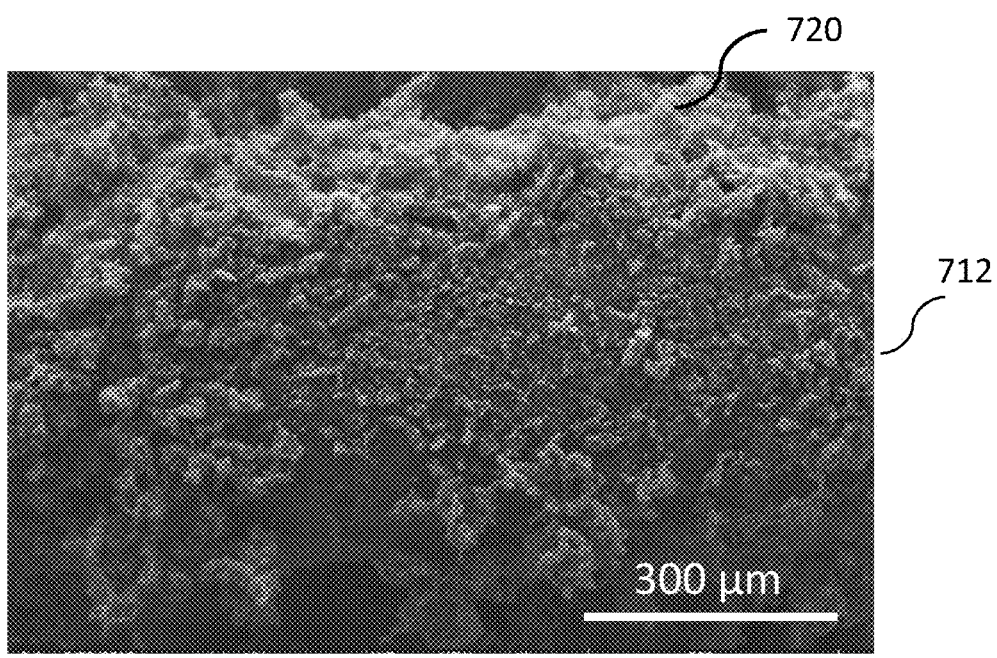

FIGS. 7A-7D show example SEM images of 3D carbon materials grown onto fibers using plasma energy from a microwave plasma reactor as well as thermal energy from a thermal reactor. FIG. 7A shows an SEM image of intersecting fibers 711 and 712 with 3D carbon material 720 grown on the surface of the fibers. FIG. 7B is a higher magnification image (the scale bar is 300 μm compared to 500 μm for FIG. 7A) showing 3D carbon growth 720 on the fiber 712.

Figure 7C:
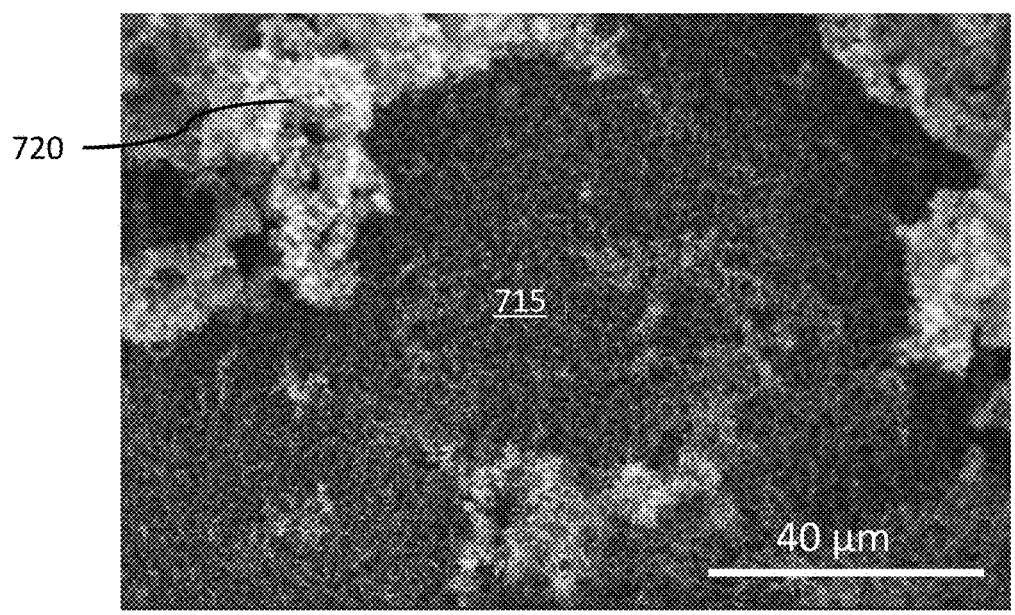
Figure 7D:
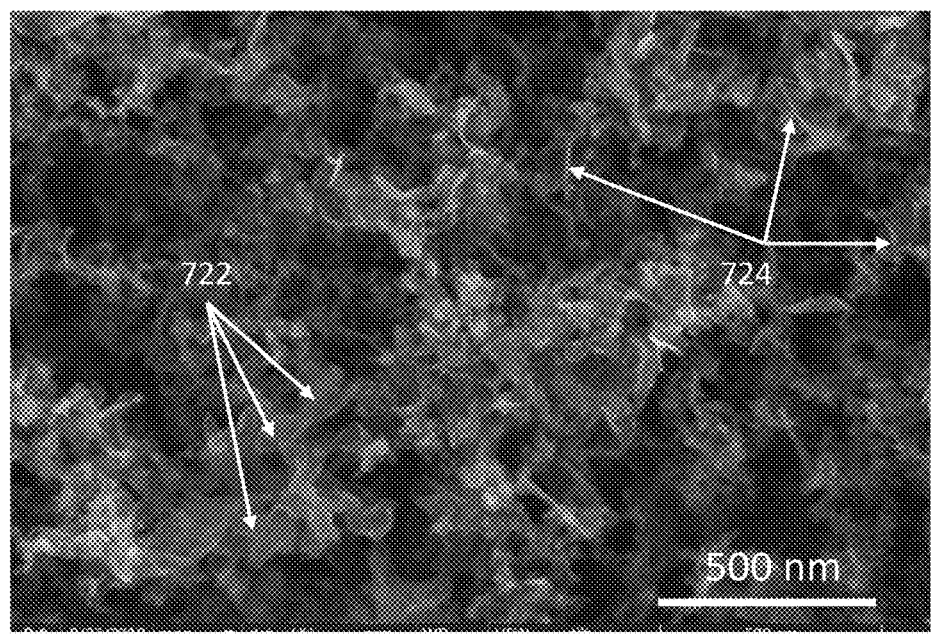

FIG. 7C is a further magnified view (scale bar is 40 μm) showing 3D carbon growth 720 on fiber surface 715, where the 3D nature of the carbon growth 720 can be clearly seen. FIG. 7D shows a close-up view (scale bar is 500 nm) of the carbon alone, showing interconnection between basal planes 722 and edge planes 724 of numerous sub-particles of the 3D carbon material 720 grown on the fiber. FIGS. 7A-7D demonstrate the ability to grown 3D carbon on a 3D fiber structure according to some embodiments, such as 3D carbon on carbon fiber growth.

In some embodiments, 3D carbon growth on fibers can be achieved by introducing a plurality of fibers into the microwave plasma reactor (e.g., through an inlet 202 of the system 200 in FIG. 1A) and using plasma in the microwave reactor to etch the fibers. The etching creates nucleation sites such that when carbon particles and sub-particles are created by hydrocarbon cracking in the reactor, growth of 3D carbon structures is initiated at these nucleation sites. The direct growth of the 3D carbon structures on the fibers, which themselves are three-dimensional in nature, provides a highly integrated, 3D structure with pores into which resin can permeate. This 3D reinforcement matrix (including the 3D carbon structures integrated with high aspect ratio reinforcing fibers) for a resin composite results in enhanced material properties, such as tensile strength and shear, compared to composites with conventional fibers that have smooth surfaces and typically delaminate from the resin matrix.

Functionalizing Carbon

In some embodiments, carbon materials, such as 3D carbon materials described herein, can be functionalized to promote adhesion and/or add elements such as oxygen, nitrogen, carbon, silicon, or hardening agents. In some embodiments, the carbon materials can be functionalized in-situ—that is, within the same reactor in which the carbon materials are produced—or in post-processing. For example, the surfaces of fullerenes or graphene can be functionalized with oxygen- or nitrogen-containing species which form bonds with polymers of the resin matrix, thus improving adhesion and providing strong binding to enhance the strength of composites.

Embodiments include functionalizing surface treatments for carbon (e.g., CNTs, CNO, graphene, 3D carbon materials such as 3D graphene) utilizing plasma reactors (e.g., microwave plasma reactors) described herein. Various embodiments can include in-situ surface treatment during creation of carbon materials that will be combined with a binder or polymer in a composite material, and/or surface treatment after creation of the carbon materials (but still within the reactor).

Figure 8A:
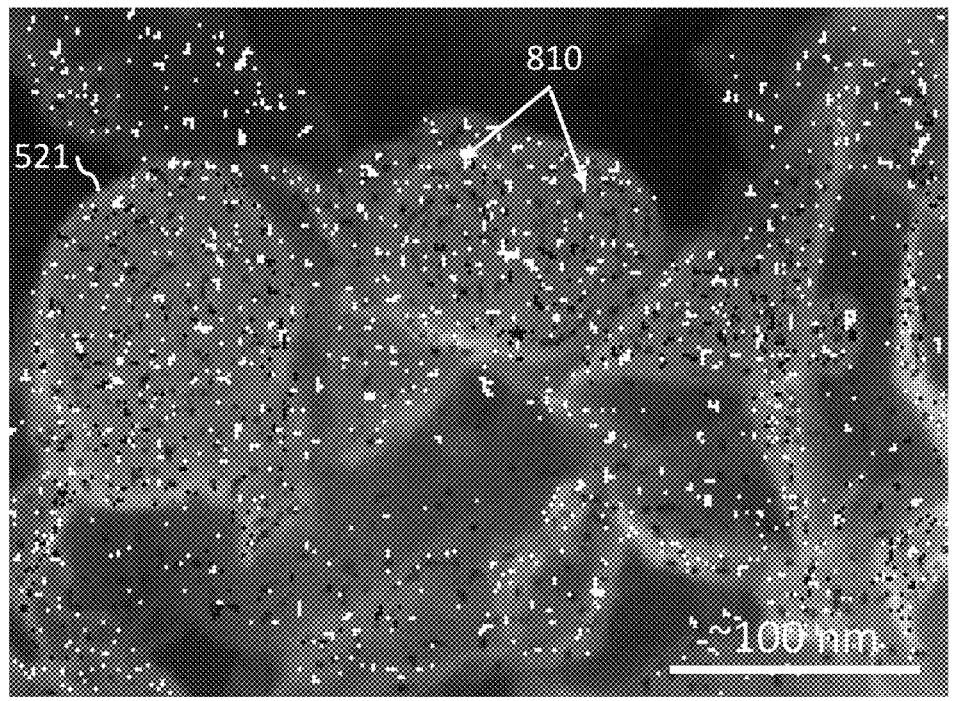
FIGS. 8A-8B are images illustrating functionalized carbon materials, in accordance with some embodiments.
Figure 8B:
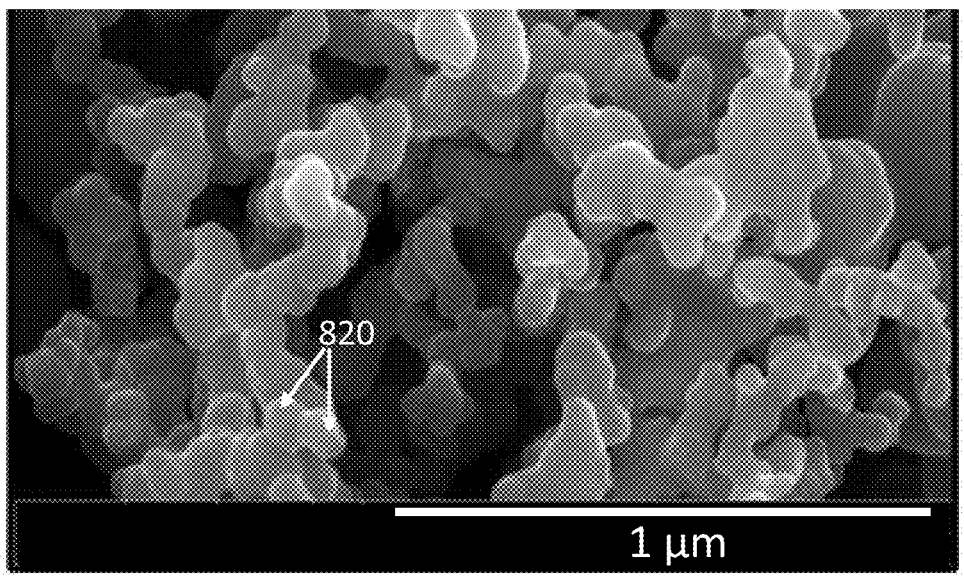

FIG. 8A is a diagram representing functionalized carbon, in which the 3D graphene of FIG. 4A, with FLG sub-particles 521, is illustrated as being modified with functionalized groups as symbolized by the black and white dots 810. FIG. 8B is an SEM of 3D carbon material functionalized with a Group 6 non-metal element in single percentage. Although functional elements are unable to be visualized in this SEM, the interconnection of GNP sub-particles 820 is clearly visible in FIG. 8B.

The functionalized carbon can be used to enhance bonding with a resin. In some embodiments, functionalized carbon can be grown on a fiber matrix, such as described in relation to FIG. 6. In some embodiments, carbon particles (alone or integrated onto fibers) are functionalized in-situ in the reactor in which the carbon particles are produced. That is, in some embodiments carbon particles are functionalized to be compatible with the resin by promoting chemical bonding, such as covalent bonding, and/or physical bonding, such as pi-pi interactions along with hydrogen bonding, between the carbon particles and the resin. For example, the functionalization may include surface oxidation or nitridation to hydroxylate or nitrogenate the carbons, to promote bonding with a resin. Furthermore, a surface preparation may be performed to clean and prepare the carbon surface to receive the polymer. The functionalization may also include surface doping or surface alloying, such as $C_xN_y$, $Al_xC_y$, $Si_xC_y$, $NiXC_y$, $Cu_xC_y$, $N_xC_y$, or elements such as Be, Sc, Mg, Ti and Pt. In some embodiments, the carbon may be functionalized with one or more of H, O, S, N, Si, aromatic hydrocarbons, Sr, F, I, Na, K, Mg, Ca, Cl, Br, Mn, Cr, Zn, B, Ga, Rb, Cs, amine groups, acid groups (e.g., COOH, OH), or additional polymers.

In various embodiments of the present carbon materials and composite materials, functionalizing the carbon surface can enhance surface wettability (i.e., surface activity), allowing for enhanced wetting between carbon materials and resin. For example, carbons may be functionalized to increase wettability (i.e., create a low contact angle with the resin) which improves integration of the carbons with the resin. In some embodiments, chemical additives can be added into the carbon-resin system to allow for better anchoring of particles within the resin, which can also lead to increased mechanical properties of formed composite materials. This is because properly anchored materials will not settle out of the resin system and will stay fully suspended. Examples of chemical additives include, but are not limited to, non-ionic surfactants and dispersants containing polyethylene oxide chains and hydrophobic groups, which allow better chemical bonding of carbon to the polymer matrix.

In various embodiments of the present composite materials, the mixture of resin and carbon remains in an unhardened state which can then be utilized as a raw material for various applications such as forming parts or being applied as a coating. The unhardened composite material may be types of resin systems such as two-part systems or systems in which a cross-linking agent or a hardening agent is added to initiate curing. In other embodiments, the carbon/resin mixture can directly produce a hardened material, such as in embodiments where the carbon starting particles are functionalized with a hardening agent, and the functionalized carbon initiates cross-linking when entering into the resin. The functionalized carbon particles having the hardening agent could be directly embedded into the resin in the reactor that is used to produce and functionalize the carbon, as shall be described in more detail in the next section. The resulting resin/carbon composite material in which the carbon includes a hardening agent may provide a composite material that is in a state ready for molding, for example. The carbon in such a molding scenario could be a carbon matrix material in which a functionalized graphene is designed to be both a strength-enhancing material and a hardener.

Figure 9:
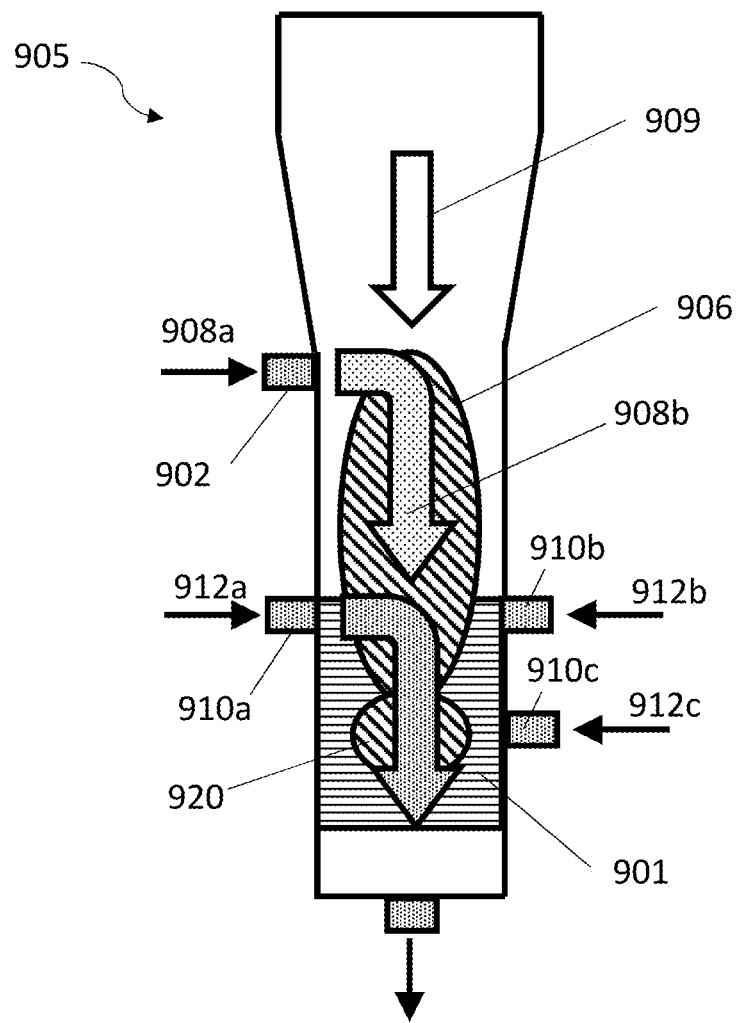
FIG. 9 is a schematic of a field-enhancing waveguide, in accordance with some embodiments.

FIG. 9 is a schematic of a field-enhancing waveguide 905 a portion of a microwave plasma reactor, where other portions of the reactor are not shown for simplicity. The FEWG 905 includes a supply gas inlet 902 configured to receive supply gas 908a flowing into the FEWG 905, and process material inlets 910a, 910b and 910c configured to receive process materials 912a, 912b and optionally 912c. High-frequency energy 909 creates a plasma 906 in a supply gas 908a and/or process material 912a. The generated plasma 906 provides energy for reactions to occur in process material 908b within a reaction zone 901 of the FEWG 905.

In some embodiments, process material 912a is a hydrocarbon substance such as a gas, liquid, or colloidal suspension from which the carbon material will be produced by a cracking process. Process material 912b may be a substance, such as a gas or liquid, to produce functional groups for functionalizing the carbon in situ within the FEWG 905. Process material 912c may be a functionalization or doping material that is a different substance from process material 912b, or may be fibers (e.g., a fiber matrix on which carbon particles will be grown) as described above. Process material inlets 910a, 910b and 910c are shown to be in different locations upstream and downstream from each other in FIG. 9 but in other embodiments may all be in the same location or a combination of same and different locations. The locations of process material inlets 910a, 910b and 910c may be used to alter where reactions occur, such as within the plasma 906 and/or in an afterglow region 920, to customize properties of the carbon materials.

Functionalizing carbons using the present reactors and methods provides unique advantages over conventional reactors and methods by bringing additional gases or liquids (containing functional elements, doping materials and/or hardening agents) into the vicinity of the plasma in which carbon materials are being produced. This allows for hydrocarbon species to be cracked in the vicinity of the functionalizing materials during or slightly after the carbon materials are grown. Functional groups may be introduced directly into the plasma or the plasma afterglow, onto freshly made surfaces of the produced carbon, and creating stronger bonds than by functionalizing previously produced carbon particles. This is because carbon surfaces have a high surface energy when carbon is created. The functionalization is performed by gas-gas interaction; that is, in a vapor form instead of, for example, wet chemistry. Conventional methods such as plasma-enhanced chemical vapor deposition (PECVD) involve vapor forms; however, functionalizing within a hydrocarbon cracking plasma reactor is more difficult than standard PECVD because of the difficulty in adding other species into carbon cracking processes. Introducing other species creates a large number of process parameters, all of which interact with each other. In the present embodiments, it has been found that functionalization during the carbon formation process is possible only in a small window of process parameters, such as to prevent the functional groups from growing on the surface of the reactor which would terminate the hydrocracking process. Functionalization of carbon materials in-situ (in the reactor while the carbon material is being grown) is accomplished through control of aspects such as partial pressure, flow rate of supply gas and process gas, power level of the high-frequency energy, and use of a non-equilibrium plasma mode, along with utilizing reactors with different designs (e.g., using various reactor zones or different temperature and energy zones). Additionally, functionalization may be performed in the plasma itself or in subsequent parts of the flow stream of the particles (e.g., high temperature plume after the plasma) to further tailor chemical reactions between the functionalizing elements and carbon materials.

In some embodiments, the reactor can comprise different zones, where creation of the carbon particles and functionalization of the carbon particles can occur in one or more zones. For example, creation and functionalization of the carbon particles can occur essentially simultaneously in one zone. In another example, carbon particles can be created in one zone of the reactor, and then functionalization can occur in a subsequent zone. In another example, i) carbon particles can be created in a first zone of the reactor where the microwave plasma is present; ii) a plurality of fibers can be introduced into the first zone within the plasma and/or into a second zone comprising a thermal high temperature plume of the reactor, where the fibers are etched and 3D carbon is grown onto the fibers and/or the fibers are adhered together at interconnection points; and iii) functionalization of carbon can occur in a third zone.

In some embodiments, the 3D carbon materials, whether functionalized or not, may beneficially provide anisotropic properties (i.e., directional properties in one or more of the X, Y, Z dimensions) through a natural randomness of their structures. In some embodiments, the 3D carbon materials, whether functionalized or not, maybe enhanced multi-directionality of properties, such as increasing electrical conductivity through 3D interconnection of carbon sub-particles.

Because of the carbon-resin bonds that are promoted by carbon functionalization, the reinforcing carbon fillers of the present composite materials are more dispersed (i.e., are low-aggregating or less-aggregating dispersions) compared to conventional composites, and high loadings of carbon filler material (e.g., greater than 40% or greater than 50%) can be achieved within a resin system. In some embodiments, the carbon filler particle sizes in the composite material have a small size, such as 200-400 nm, which aids in the dispersion. The resin loaded with carbon has processability (the rheology of a polymer-carbon mixture before curing) that is suitable for use in various applications, including but not limited to prepreg applications, molding applications, and extrusion processes. The carbon filler particles in the present carbon-resin mixtures are suspended, similar to a colloidal solution, due to a well-dispersed and fully wetted filler material where in some cases the filler can also be chemically bonded to the resin.

In some embodiments, carbon-metal matrix materials are produced by doping or mixing the carbon with metal, such as by metal impregnation on carbon via chemical bonding using a plasma reactor. In some embodiments, the carbon-metal matrix material particles can be reduced in size by mixing with a resin, resulting in carbon/metal interfaces such that the reduced-size carbon/metal particles within the resin composite can bind to metal supporting structures. Metal doping of carbon can be utilized to create organometallics, where carbon particles are functionalized with metal, to be compatible with a metal-based binder (e.g., a carbon-infused metal, or a carbon-metal covetic material).

The bonding between carbon additives, resin, and fibers (if included) provide improved composite properties compared to conventional materials. For example, functionalized carbon structures grown on fiber materials provides energy transfer modification such that energy applied to the composite material is distributed throughout all the sub-components of the fiber-reinforced composite systems. In another example, crack propagation is mitigated by stress termination (e.g., termination of dangling bonds) that is enabled by functionalization and/or creation of carbon-carbon connections between sub-particles of the present carbon materials. Toughened resins may also be formulated, where plastic versus elastic behavior can be managed such as by adjusting the concentration of functional species and/or tuning the type of bonds between the carbon and polymer. In some embodiments, high strength can be achieved without increasing viscosity due to functional groups being integrated into the carbon as the carbon is grown, in contrast to conventional composites in which higher reinforcement typically leads to higher viscosity.

In addition to the functionalization of carbon materials described in this section, other treatments of the carbon materials may be utilized to enhance incorporation of the carbons with resins. Example methods include etching of carbon surfaces, surface roughening, and/or treating the carbon surfaces to remove contaminants. In some embodiments, a clean surface of the carbon that is non-exposed to an environment may itself serve as a functionalized surface, for example by directly injecting carbon into a resin composite system so as not to expose the carbon materials to ambient conditions (e.g., a surface being exposed only to a resin after formation of the carbon). Other examples of modifications or treatments of carbon materials include, for example, structural or morphology modification, surface promotion (e.g., through surface chemistry), and use of environmental constraints (e.g., promoting bondability of the carbon materials to resins via creating specific environmental conditions in which the carbon materials are produced, such as different types of inert atmospheres in the reactor).

In Situ Resin Embedding

In some embodiments, the carbon particles are produced in a reactor and are combined (e.g., mixed) with a resin in a container. In other embodiments, the carbon and resin are combined by directly embedding carbon particles (functionalized or non-functionalized) into the resin within the reactor that is used to grow (and optionally functionalize) the carbon particles, such that no contact from an external resource is required. That is, the resin and carbon can be combined within the reactor without the need for any human contact. For example, the resin may be flow-injected or liquid-injected into the reactor, creating vapor-vapor interaction between the carbon particles and polymer. In some embodiments, the composites include producing graphene nanoparticles (e.g., 3D graphene) or carbon nano-onions that are injectable into a binder (i.e., resin, polymer) to produce composite materials. Some embodiments include injection molding or forging parts from the composite materials.

Returning to FIG. 9, in some embodiments the process material 912c can be a resin that is introduced into inlet 910c. Types of resins into which carbon materials can be embedded include thermosets, thermoplastics, polyesters, vinyl esters, polysulfones, epoxies, rigid amines, novolacs, and polyimides. Process material 912b may be gases or liquids used to functionalize the carbon materials to be more compatible with (i.e., enhance or promote bonding with or wetting with) the resin.

Directly embedding carbon particles into a resin in situ can provide benefits such as creating stronger bonds between the carbon and resin due to avoiding exposure of the carbon particles to an ambient environment (e.g., air and moisture). This is because surfaces of carbon particles can be more reactive immediately after the particles are formed, compared to after being exposed to an ambient environment (e.g., oxygen) after being collected from a reactor. Consequently, combining carbon particles with polymer particles within the reactor in which the carbon particles are created, prior to the carbon particles existing the reactor, can provide enhanced bonding between the carbons and resin and improved composite materials properties. Integrating resins with carbon materials in-situ in a hydrocarbon cracking plasma reactor is counterintuitive to conventional practices because introducing additional species into the cracking processes greatly increases the complexity of determining process parameters which can be successfully used, as described above regarding in-situ functionalization. For example, introducing resins into the reactor without having the resins build-up on the reactor walls or without affecting desired growth characteristics of the carbon is extremely complex and not straightforward from conventional practices.

Additional Energy/Mixing

Figure 10A:
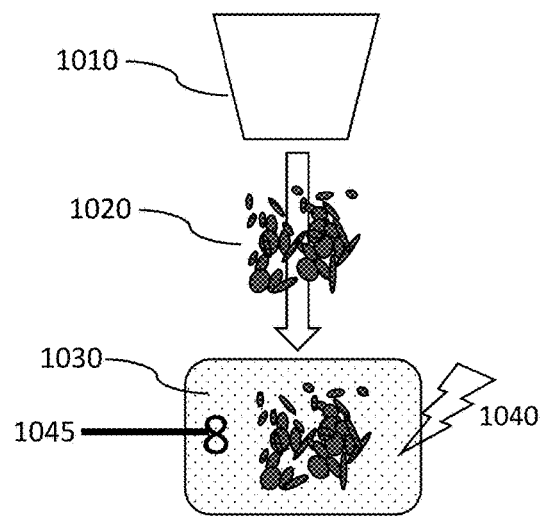
FIGS. 10A-10B are schematics of adding energy into a composite material, in accordance with some embodiments.
Figure 10B:
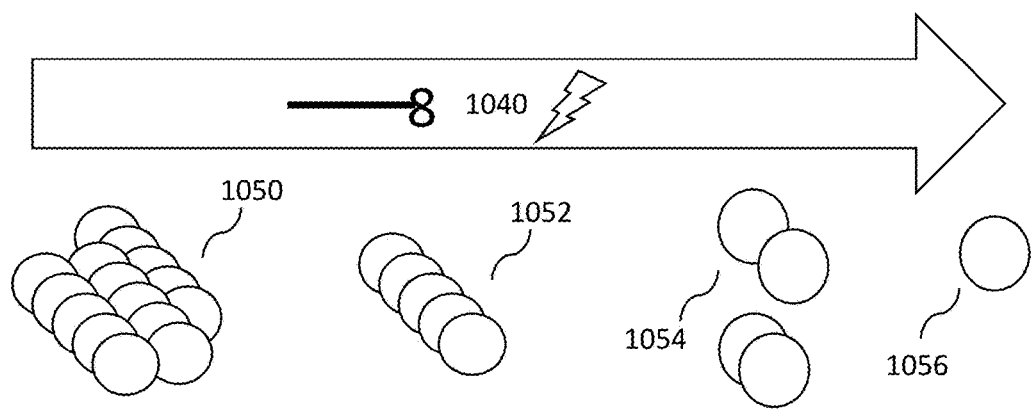

FIGS. 10A-10B are simplified schematics of embodiments in which the sizes of the carbon particles may be reduced when combining the carbon particles with resin to produce a composite material. That is, the carbon particles are reduced in size from a starting particle size to a final particle size during the process of being incorporated with the resin. In FIG. 10A, carbon particles are produced in a reactor 1010, which may be, for example, the microwave plasma reactors as described herein. The produced carbon particles 1020, which can be modified (e.g., functionalized) in the reactor 1010 or non-modified and can be of nanometer to micron size, such as on the order of 100 microns, are used as starting particles and serve as a filler material to be combined with a resin 1030. In some embodiments, the starting particles can be injected into an uncured or unhardened resin bath (i.e., a volume of resin contained in a vessel). In other embodiments, the mixing can be achieved by flow-injecting the resin into the carbon stream of the reactor, such as in the plasma zone and/or in the plasma afterglow. Energy 1040 is input into the carbon/resin mixture, where the energy 1040 may be mechanical mixing 1045 that applies mechanical forces, such as shear forces, to the particles within the resin. The energy-adding system may also include thermal or high frequency energy input to aid in the process, in addition to or instead of mechanical mixing 1045. For example, large particles can be injected into the resin and mechanical energy is added along with thermal and/or microwave energy. The additional energy 1040 (e.g., mechanical, thermal, and/or high-frequency) can serve various purposes including, but not limited to, aiding in the process of breaking up the carbon starting particles and helping to chemically bind the carbon to the polymer (resin). The supplemental energy 1040 can be supplied in the form of, for example, mechanical mixing 1045, thermal heating, and/or microwave heating.

FIG. 10B is a graphic illustration showing the effect of the supplemental energy 1040 on particle size, where energy can be, for example, mechanical (e.g., mechanical mixing 1045) or thermal. Particles of the starting material can be aggregates 1050 of a size up to, for example 100 microns. Energy 1040 can be imparted to the particles via one or more of applying shear forces to the particles, homogenizing the particles, or mixing the particles. The mechanical or thermal energy breaks up the particles into smaller sizes 1052, 1054 and 1056, which consequently creates fresh surfaces for the resin (i.e., polymer) to bind to. The smaller sizes 1052, 1054 and 1056 may involve breaking carbon particles into various-sized groups of sub-particles, such as groups of GNP sub-particles. As discussed earlier, newly exposed surfaces that have not been exposed to an ambient environment may provide increased bonding with polymer molecules.

In some embodiments, mechanical shearing is used to break up the carbon (or formulated/functionalized carbon) particles, which facilitates dispersion of the carbon throughout the resin. The dispersion can be achieved with mechanical mixing, chemical methods (e.g., adding an organic solvent or surfactant to promote a bonded carbon-organic-polymer), or a combination of these. Increased dispersion can be desirable for improved uniformity of material properties throughout the composite material, and improvements in the properties themselves. Examples of improved properties include, but are not limited to, mechanical strength, toughness, flexural modulus, electrical conductivity and density (e.g., more lightweight). The increased number of small sheared surfaces of the carbon particles after mixing (which may remain as 3D carbon structures in some embodiments) compared to fewer larger surfaces of the starting carbon particles allows for a greater amount of resin/surface anchoring. This higher amount of surface binding can lead to, for example, improved electrical conductivity and/or mechanical properties. In general, the smaller particles resulting from the energy input into the resin/carbon mixture changes the surface area, structure, and surface activity compared to the larger size of the starting carbon particles. Surface area refers to the total area of the carbon material surface, including that which is available to interact with the resin. Particle size and shape can affect the surface area. Structure describes the shape of the particles. The structure can be affected by the number of particles (or sub-particles) fused together and the configuration of the particles within aggregated particles. Surface activity relates to the strength of the surface interaction between the carbon filler material and the resin/polymer. Surface activity can impact the dispersion properties of the carbon materials within the resin.

In further embodiments, external energy can be applied in order to heat or cool the resin to modify the viscosity. For example, the resin viscosity can be modified during mixing in order to change the shear forces on the carbon particles. In another example, the viscosity of the resin can be modified to change the elastic modulus of the final composite (e.g., an increased viscosity of the composite material may aid in suspending the carbon particles in the mixture). In some embodiments, cooling or heating may be employed to aid in hardening or curing of the polymer.

Engineered Defects

In some embodiments, the carbon materials of the present disclosure have engineered defects within the carbon particles to enable further tunability (i.e., customization) of the carbon and consequently of the properties of the composite materials made from the defect-engineered carbon particles. Embodiments include engineering defects into structured carbon materials—that is, carbon materials that are designed with defects specifically for incorporation with resins, such as 3D carbon structures and/or functionalized carbon materials. In some embodiments, carbon particles are produced in a microwave reactor where defects are engineered into intentional defect locations between sub-particles in the carbon particles or between particles (which may also be referred to as an agglomerate), such that the particles or aggregates are broken down (e.g., fragmented) from a starting particle size to a smaller, final particle size that is determined by the defect locations. In some embodiments, energy dissipation within the system is managed to relieve or concentrate forces, such as by engineering 3D structures with pore matrix geometries and/or weakened bonds that allow for energy movement into or along a specified plane. This allows for varied interaction between the filler-filler and filler-polymer where the filler is a carbon-based material.

Figure 11A:
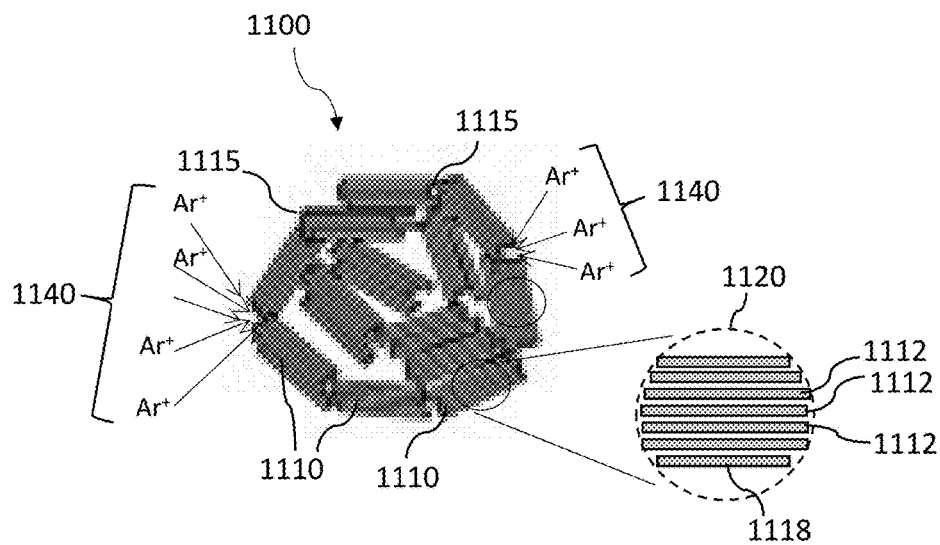
FIGS. 11A-11B are schematics of carbon materials with engineered defects, in accordance with some embodiments.

FIG. 11A shows a schematic of engineered defects according to some embodiments, using 3D graphene as an example carbon material. 3D graphene particle 1100 is made of a plurality of few layer graphene sub-particles 1110 (which may also be MLG and/or SLG sub-particles in various embodiments), each sub-particle 1110 being made of up to graphene layers 1112 as shown in the detailed, cross-sectional view 1120. The FLG sub-particles 1110 are building blocks for the 3D graphene particle 1100 and are interconnected at various edges 1115 in this embodiment, although the connections may also include edge-to-basal plane and basal plane-to-basal plane locations. The interconnected sub-particles 1110 form a 3D assembled structure that has open spaces (i.e., pores) between the sub-particles 1110 as described previously in relation to FIG. 3. The sub-particles 1110 and interconnections are formed in a plasma reactor as described herein. The innate mechanical properties (e.g., elastic modulus, tensile strength) of the single layer graphene (e.g., layers 1112) are uncompromised or maintained—that is, having minimal basal plane defects—during creation of the particle 1100.

One example of engineered defects is creating selectively weakened sites within the particle 1100. In a post plasma process, such as in the high temperature plasma afterglow of the reactor, interconnection contact points between the FLG sub-particles 1110 can be selectively weakened by a focused and concentrated impingement of sputtering atoms 1140. The connection points are high angle contact points having sharp asperities or transitions which concentrate the sputtering energy while at the same time, minimize ion impingement onto the flat, low angle, basal plane surfaces 1118 of pure graphene. Sputtering atoms 1140 are depicted as argon in this embodiment but may be other elements such as, but not limited to, nitrogen, oxygen, ammonia ($NH_4$), or other active and reactive species. In some embodiments, a selective bias field can be applied to the 3D aggregate structure 1100 such that the bias fields are concentrated at the edges of the FLG sub-particles 1110 and correspondingly further focus the sputtering atoms at these selective sites. The location of the defects may be selectively chosen based on, for example, injection mode of the sputtering atoms, gas particle pressure and plasma temperature. The weakening of sites is caused by reducing the number of carbon-carbon bonds at the connection points. A greater number of weakened sites will result in the particle 1100 being fragmented into smaller particle sizes when, for example, a shear or mixing force is applied.

In some embodiments, carbons may be grown to be weakly bonded from the start, or the carbons may be grown and then defects are added. In some embodiments, the defects may be engineered into carbon particles using a plasma reactor with multi-stage reactor zones. High-frequency energy such as microwave energy can be targeted effectively in the location where the energy is applied, enabling selectivity in creation of defects in the present embodiments. In contrast, thermal energy acts on bulk properties which can compromise the innate structure of the carbon material (e.g. graphene). Use of high-frequency energy, such as microwave energy, beneficially preserves the characteristics or nature of the platelets, and can be targeted primarily at the interconnections between sub-particles, whether the connections are edge-edge, edge-basal or basal-basal types.

Figure 11B:
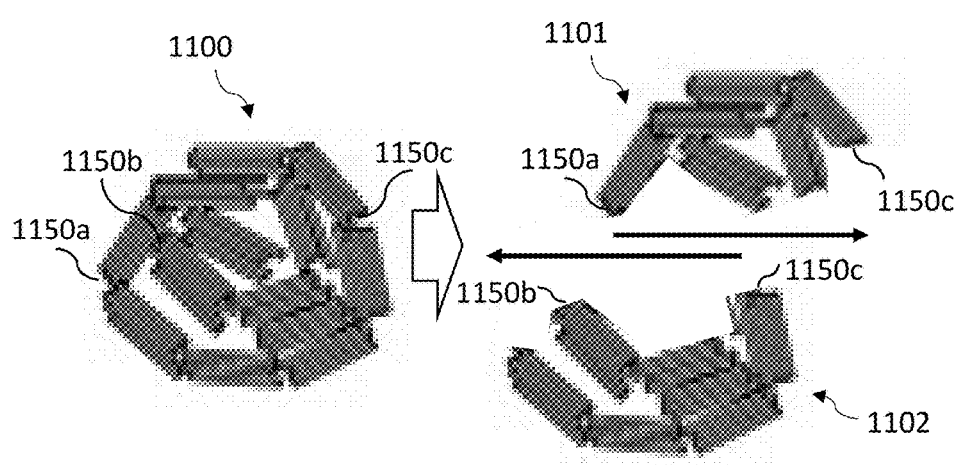

FIG. 11B shows a benefit of engineered defects in customizing the sizes of carbon particles for use in a composite material. In FIG. 11B, particle 1100 has multiple defects engineered into edges of sub-particles, such as at defects 1150*a*, 1150*b* and 1150*c*. A high energy shear process or any shear process that incorporates energy into the fluid, such as from energy applied during mixing of carbons with a resin, causes the particle 1100 to be broken up into smaller, fragmented particles 1101 and 1102 at the defect locations. Fragmented particles 1101 and 1102 have an average final particle size (which may be measured in dimensions or volume) that are smaller than the average starting particle size of particle 1100. The smaller particles 1101 and 1102 are readily dispersible fragments due to the creation of freshly cleaved, philic (wettable) surfaces at the sheared locations of defects 1150*a*, 1150*b* and 1150*c*. Thus, through the application of high energy shear forces during the mixing of particles within an uncured/unhardened resin, freshly cleaved surfaces become instantaneously in contact with the resin without contamination. At the same time, fracturing of the 3D particles during high energy shear process within a resin maintains the innate mechanical integrity of FLG sub-particles 1110.

The ability to engineer a structured carbon material to break down to a particular size is a unique and important ability of structured carbons that promote improvements to composite materials containing those materials. The materials are engineered to allow for minimal exposure to ambient conditions even when set aside for a period of time in ambient environments. The larger engineered material keeps the internal materials encapsulated for exposure only at specific moments in the processing (e.g., when further energy such as is found in shearing or mixing when combining the carbons with a resin). The engineered materials have specifically tuned fracture planes, which in turn allows for specific behaviors in post-processing, so as to inure end use properties to carbon-resin composites.

In some processing recipes the structured carbon has at least one tuned fracture plane. Such structured carbons that have a tuned fracture plane are mixed with additional materials in quantities and formulations that are controlled based at least in part on application-specific end-component specifications. Moreover, the specific fracture planes of the structured carbons can be controlled during processing within the reactor. Strictly as one example, by using intra-reactor processing techniques, the structured carbons that are produced can be tuned to have fracture planes that are engineered for specific end-product characteristics. For example, in one formulation, the structured carbons produced in a microwave reactor are purposely not compressed before use in post-processing steps, where consequently, the only necessary post-process needed is a mixing step with resin that results in a compounded composite.

In some engineered formulations, the fracture planes within the present carbon materials are defined by the occurrence or absence of bonded/non-bonded carbon atoms. A fracture plane can be engineered by introducing weakly bonded area(s) into the lattice by introducing a gap or a hole, or by introducing a dangling bond. These weakly bonded area(s) can be purposely caused by introduction of non-carbon chemicals into the carbon system to form different bonds. For example, by introducing a measured amount of oxygen into the reactor during formation of the structured carbons, weaker C—O bonds (i.e., weaker than C—C bonds) can be formed in the lattice. Since the energy associated with each type of bond is different, the planar structure of the lattice can be engineered for intentional failure at a specific location or plane or area.

In some embodiments, defects (e.g., lower energy bonds) are purposely engineered-in to ensure the critical length or geometry of the final material has a specific strength-to-length or strength-to-volume ratio. These lengths can be tailored for specific end-application uses of the resulting carbon-resin composite.

Purposely engineered-in defects result from tuning the growth of the carbon structure. Such tuning can be accomplished by controlling reactor process conditions such as gas flow rate, residence time, flow velocity, Mach number, hydrocarbon concentration and the like, to name but a few. Other process conditions that can be controlled so as to tune the growth of a lattice include plasma specific conditions such as plasma concentration, heat profile gradients, disorientation within the plasma energy, ionization energy potential, collision frequency, microwave wave modulations, and microwave frequencies.

These controls allow for specific types of localized structural growth and/or minimize the growth of carbon in a particle orientation. As one example of tuning growth within a reactor: (1) as a hydrocarbon atom enters into a plasma zone, it will start to break C—H, C—C bonds in a particular and calculated fashion; (2) as the molecule is broken down into many C and H bonds, they become highly reactive; then (3) the materials are exposed to a higher (or lower) energy state by modulation of microwave energy in the reactor. The higher (or lower) energy states correspond to a preferred growth path. Depending on the tuning of the growth, a lattice with some relatively stronger (or relatively weaker) planes is formed. In post-processing, the resulting structured carbon breaks down along the weaker planes. The breakdown along the engineered-in weaker planes of the structured carbons facilitates molecular combination with polymers, as described above, so as to result in high-performance carbon-containing elastomers.

Methods

Figure 12:
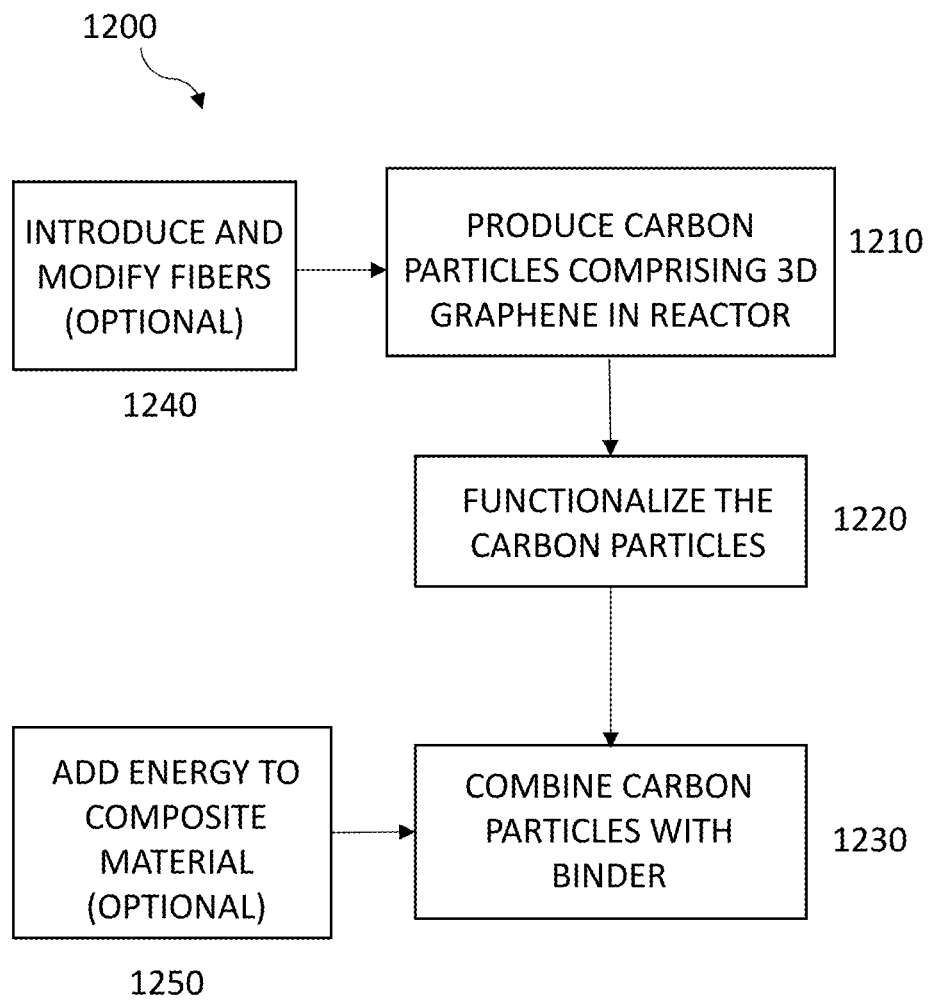
FIG. 12 is a flowchart of methods for producing composite materials, in accordance with some embodiments.

FIG. 12 is a flowchart 1200 representing methods of producing composite materials, according to some embodiments. Methods include producing a plurality of carbon particles in a plasma reactor in step 1210. In some embodiments, the plurality of carbon particles comprises 3D graphene, where the 3D graphene comprises a pore matrix and graphene nanoplatelet sub-particles in the form of at least one of: single layer graphene (SLG), few layer graphene (FLG), or many layer graphene (MLG). The method of FIG. 12 also includes functionalizing the plurality of carbon particles in-situ in the plasma reactor to promote adhesion to a binder in step 1220 and combining the plurality of carbon particles with the binder to form a composite material in step 1230.

In some embodiments, the plurality of carbon particles has a phase purity of graphene nanoplatelets of greater than 99%. The carbon particles, such as GNP sub-particles, may have a 3D structure in an X-Y plane and in a Z direction, where the graphene nanoplatelet sub-particles are connected to each other, forming the pore matrix. The 3D carbon particles may have sub-particles, such as GNP sub-particles, that are connected to each other with carbon-carbon bonds in a plurality of locations comprising edge-to-edge, edge-to-basal plane and basal plane-to-basal plane locations. The pore matrix includes voids or spaces between sub-particles or within sub-particles (e.g., between layers of graphene nanoplatelets). For example, the pore matrix may include pores between the graphene nanoplatelet sub-particles or pores between layers of the FLG or MLG.

In some embodiments, fibers may be introduced into the plasma reactor in step 1240 for incorporation into the carbon-resin composite. In some embodiments, the fibers are modified, such as by being etched, and serve as a structure on which carbon particles are grown. For example, step 1240 may involve introducing a plurality of fibers into the plasma reactor (e.g., a microwave plasma reactor), modifying the plurality of fibers within a plasma or a high temperature plume of the microwave plasma reactor, and growing the plurality of carbon particles on the modified plurality of fibers. In some embodiments, the fibers may be modified in a different reactor than the reactor for in which the carbon particles are produced (e.g., prior to being input into the plasma reactor). In some embodiments, the carbon particles are 3D carbons, such as 3D GNPs that are grown on the fibers.

The producing of carbon particles in step 1210 may be performed using a plasma reactor as described in FIGS. 1A-1B and also may include use of other reactors such as thermal reactors to provide energy for growth of the carbon particles. In some embodiments, the plasma reactor may be a high frequency plasma reactor, the high frequency being radiofrequency (RF), very high frequency (VHF), ultra-high frequency (UHF), or microwave frequency. For example, the plasma reactor may be a microwave plasma reactor having a field-enhancing waveguide and a microwave energy source, where the field-enhancing waveguide serves as a reaction chamber in which the plurality of carbon particles is produced. The field-enhancing zone has a decreasing cross-sectional area between a first cross-sectional area and a second cross-sectional area of the field-enhancing waveguide, where the second cross-sectional area is smaller than the first cross-sectional area. The reaction zone is formed by the second cross-sectional area extending along a reaction length of the field-enhancing waveguide. The microwave energy source is coupled to the field-enhancing waveguide and provides microwave energy into the first cross-sectional area of the field-enhancing zone, where the microwave energy propagates in a direction along the reaction length of the reaction zone. The microwave plasma reactor is absent of a dielectric barrier between the field-enhancing zone and the reaction zone. Methods may include inputting a hydrocarbon material (e.g., gas, liquid) into the plasma reactor and controlling parameters such as plasma mode, cracking temperature and power level to control growth rate, sub-particle and particle sizes, and/or types of carbon that are grown in the reactor. Processing temperatures in the reactor to produce the carbon materials may be, for example, 3000 K or greater, with localized temperatures of 10,000 K or greater.

Methods may also include, during production of the carbon particles in step 1210, engineering defects into intentional defect locations in the carbon particles. Defects may be engineered by impinging the carbon particles with atoms (e.g., by sputtering) to weaken bonds (e.g., carbon-carbon bonds) between sub-particles (e.g., edge-to-edge connections, edge-to-basal plane and/or basal plane-to-basal plane), where the impinging may be controlled by aspects such as an injection mode of sputtered atoms, gas particle pressure, plasma parameters (e.g., plasma concentration), and microwave parameters (e.g., microwave wave modulations, and microwave frequencies).

The functionalizing of carbon particles in step 1220 may include any of the methods and techniques described in this disclosure. In some embodiments, the functionalizing is performed in a plasma of or a high temperature plume of the plasma reactor. In some embodiments, the binder is a resin, and the plurality of carbon particles are functionalized to be compatible with the resin by promoting chemical bonding between the plurality carbon particles and the resin. Embodiments may include, for example, adding functional groups to the carbon, performing surface doping or surface alloying, adding a hardening agent to the carbon particles, altering surface wettability or performing surface treatments.

In some embodiments, the combining of carbon particles with a binder in step 1230 may be performed outside of the reactor after the carbon particles are produced. In some embodiments, the combining of carbon particles with a binder may be performed within the reactor, during or after growth of the carbon particles. In some embodiments, methods involve combining, within the plasma reactor, functionalized plurality of carbon particles with a resin to form a composite material. In some embodiments, energy may be added to the composite material in step 1250 to further customize properties of the composite material. For example, methods may include adding energy to the composite material during the combining of step 1230, where the plurality of carbon particles has an average starting particle size and the energy causes the plurality of carbon particles to be reduced to an average final particle size that is less than the average starting particle size. The energy may be, for example, mechanical energy (e.g., mixing), thermal energy, or high-frequency energy. Methods may also include, during production of the carbon particles in step 1210, engineering defects into intentional defect locations in the carbon particles, where the average final particle size (in adding energy to the composite material in step 1250) is determined by the intentional defect locations.

Figure 13:
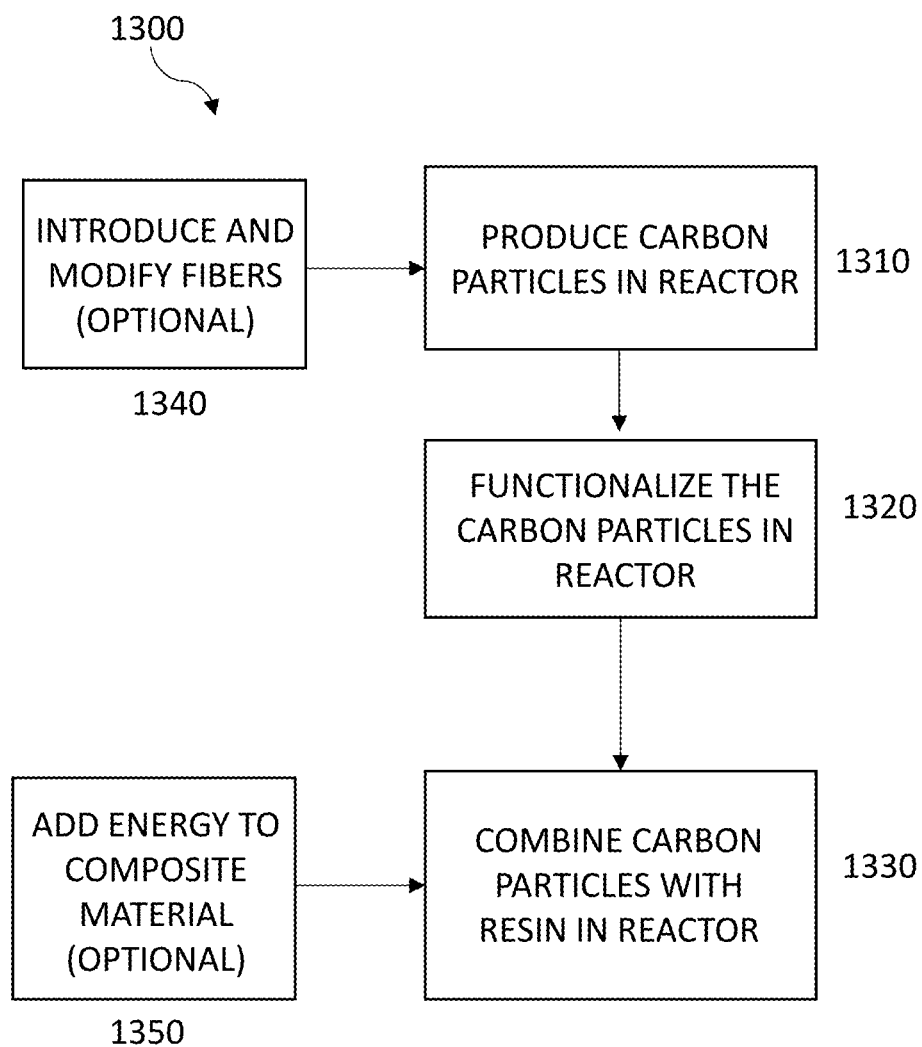
FIG. 13 is a flowchart of methods for producing composite materials, in accordance with some embodiments.

FIG. 13 is a flowchart 1300 representing methods of producing a composite material, according to some embodiments. Methods include producing a plurality of carbon particles in a plasma reactor in step 1310; functionalizing, in the plasma reactor, the plurality of carbon particles to promote chemical bonding with a resin in step 1320; and combining, within the plasma reactor, the functionalized plurality of carbon particles with the resin to form a composite material in step 1330. The carbon particles may be directly combined with the resin in the reactor, without contact from an external resource or without the need for human contact of the resin or carbon particles.

In some embodiments, the functionalizing in step 1320 is performed in a plasma or a high temperature plume of the plasma reactor. In some embodiments, the functionalizing includes oxidation, nitridation, surface doping, surface alloying, or adding a hardening agent. The functionalizing may include embodiments as described in relation to FIG. 12 and throughout this disclosure.

In some embodiments, step 1330 of combining carbon particles with a resin in a reactor is performed in a plasma or a high temperature plume of the plasma reactor. The combining of step 1330 may include embodiments as described in relation to FIG. 12 and throughout this disclosure.

In some embodiments, the plasma reactor is a microwave plasma reactor, and methods of flowchart 1300 include step 1340 of introducing a plurality of fibers into the microwave plasma reactor and modifying the plurality of fibers within a plasma or a thermal high temperature plume of the reactor, where the producing of step 1310 comprises growing the plurality of carbon particles on the modified plurality of fibers. The addition of fibers may include embodiments as described in relation to FIG. 12 and throughout this disclosure.

The carbon particles produced in step 1310 may include various allotropes such as graphene, GNPs, MWSFs and CNTs, and may be 3D structured carbon materials including any of these allotropes. In some embodiments, the carbon particles include 3D graphene, where the 3D graphene has a pore matrix and has graphene nanoplatelet sub-particles in the form of at least one of: single layer graphene (SLG), few layer graphene (FLG), or many layer graphene (MLG). The graphene nanoplatelet sub-particles are grown in an X-Y plane and in a Z direction, where the graphene nanoplatelets sub-particles are connected to each other. In embodiments in which GNPs are produced, the plurality of carbon particles may have a phase purity of graphene nanoplatelets of greater than 99%.

In some embodiments, energy may be added to the composite material in step 1350 to further customize properties of the composite material. The adding of energy in step 1350 may include embodiments as described in relation to FIG. 12 and throughout this disclosure.

The producing of carbon particles in step 1310, the functionalizing in step 1320 and the combining in step 1330 may be performed using a plasma reactor as described in FIGS. 1A-1B and also may include use of other reactors such as thermal reactors to provide energy for growth of the carbon particles. As described in relation to FIG. 12, in some embodiments, the plasma reactor may be a microwave plasma reactor having a field-enhancing waveguide and a microwave energy source, where the field-enhancing waveguide serves as a reaction chamber in which the plurality of carbon particles is produced. The field-enhancing zone has a decreasing cross-sectional area between a first cross-sectional area and a second cross-sectional area of the field-enhancing waveguide, where the second cross-sectional area is smaller than the first cross-sectional area. The reaction zone is formed by the second cross-sectional area extending along a reaction length of the field-enhancing waveguide. The microwave energy source is coupled to the field-enhancing waveguide and provides microwave energy into the first cross-sectional area of the field-enhancing zone, where the microwave energy propagates in a direction along the reaction length of the reaction zone. The microwave plasma reactor is absent of a dielectric barrier between the field-enhancing zone and the reaction zone.

Additional Embodiments

In some embodiments, methods may include formulating a monomer or choosing a resin customized to accept the plurality of carbon particles. For example, specific monomers or resins designed to bond with specific types of carbon particles (e.g., graphenes, CNOs, CNTs, and 3D structures of one or more of these) and/or bond with certain functional groups may be formulated.

Some embodiments include enhancing attachment of the present composite materials to a surface (e.g., a metal substrate) using plasma torch systems. For example, a metal surface can be modified with carbon-infused metal layers that are created by a plasma torch to achieve a high carbon content interface to which carbon-polymer composites can be attached (e.g., by fusing the metal to carbon-to-polymer bonding), thereby increasing structural strength. The carbon-infused metal layers include metal particles and carbon particles that are bonded together, which are created by ionizing at least some of the particles' atoms with a microwave plasma of a plasma torch and accelerating the metal particles and carbon particles toward the metal surface by a high electrical current. The created carbon-metal particles then deposit onto the metal surface and meld together, creating a compositionally infused bulk where carbon-metal particles continue to deposit and melt together. This carbon-loaded metal surface improves bonding of the carbon-resin composites to the metal substrate compared to attachment of a carbon-resin composite to a metal-only surface.

Figure 14:
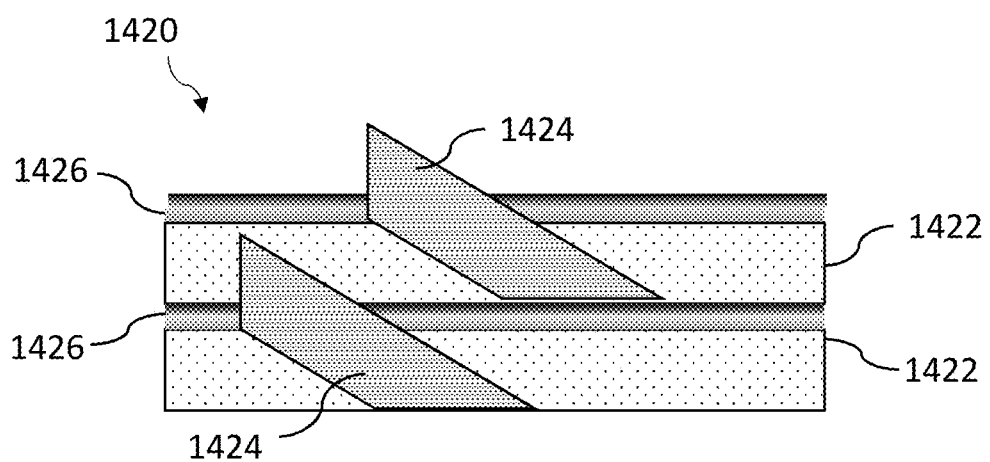
FIG. 14 shows schematics of metals incorporated with carbons for composite materials, in accordance with some embodiments.

FIG. 14 represents embodiments in which carbon-resin composite materials may be used to create organo-metallic materials. Metals may be integrated onto or into the carbon structure during creation of the carbons, in which interfacial carbon is incorporated into a metal lattice. That is, the carbon structure may be within interstitial spaces of the metal lattice structure, e.g., the metals crystal structure, such as face-centered cubic or body-centered cubic crystal structures. Metals and polymers may be fused together using such organo-metallic structures, in which various percentages of carbon materials and metal can be used to create a bond between the metal and a polymer. Structure 1420 illustrates a use of such organo-metallic materials, in which carbon fiber layers 1422 are intersected by elements 1424 (e.g., constructing the layers in an intersecting manner during fabrication of an end product). The elements 1424 can be metal and/or can be made of organo-metallic materials that have carbon within the crystal structure. The organo-metallic carbon-resin layers 1426 have carbon-metal integrated into resin to form a composite material, and the layers 1426 are sandwiched between the carbon fiber layers 1422 to provide a bond between the carbon fiber layers 1422 and elements 1424. With this structure, the carbon-resin layers 1426 provide an intermediary between the elements 1424 and carbon fibers 1422; that is, by creating a transition from metal to carbon-metal to polymer and promoting adhesion between the materials of structure 1420.

In embodiments of the present disclosure, processing steps and materials made from a combination of a thermal reactor and a microwave reactor may enable even further materials properties of high value.

Additional embodiments include injection molding of 3D carbon-resin materials. Such embodiments include injection processing for composite 3D carbon matrix materials, injection processing for functionalized 3D carbon matrix materials, and injection processing for functionalized 3D carbon matrix materials mixed with nanomaterials.

Other embodiments include functionalized 3D carbon matrix materials in energy storage devices, such as those used in batteries for high capacity, in fuel cells for high efficiency, and in flow batteries for high efficiency.

Reference has been made to embodiments of the disclosed invention. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed:

1. A method of producing a composite material, the method comprising:
   producing a plurality of carbon particles in a plasma reactor, the plurality of carbon particles comprising 3D graphene, wherein the 3D graphene comprises a pore matrix and graphene nanoplatelet sub-particles that comprise at least one of: single layer graphene (SLG), few layer graphene (FLG), or many layer graphene (MLG);
   functionalizing the plurality of carbon particles in-situ in the plasma reactor to promote adhesion to a binder; and
   combining the plurality of carbon particles with the binder to form the composite material.

2. The method of claim 1 wherein the plurality of carbon particles has a phase purity of graphene nanoplatelets of greater than 99%.

3. The method of claim 1 wherein the producing comprises growing the graphene nanoplatelet sub-particles in an X-Y plane and in a Z direction, and wherein the graphene nanoplatelet sub-particles are connected to each other, forming the pore matrix.

4. The method of claim 3 wherein the graphene nanoplatelet sub-particles are connected to each other with carbon-carbon bonds in a plurality of locations comprising edge-to-edge, edge-to-basal plane and basal plane-to-basal plane locations.

5. The method of claim 1 wherein the pore matrix comprises at least one of: pores between the graphene nanoplatelet sub-particles or pores between layers of the FLG or MLG.

6. The method of claim 1 wherein the plasma reactor is a microwave plasma reactor; and
the method further comprises:
introducing a plurality of fibers into the microwave plasma reactor; and
modifying the plurality of fibers within a plasma or a high temperature plume of the microwave plasma reactor;
wherein the producing comprises growing the plurality of carbon particles on the modified plurality of fibers.

7. The method of claim 1 wherein the plasma reactor is a high frequency plasma reactor, wherein a high frequency of the high frequency plasma reactor is one of: radiofrequency (RF), very high frequency (VHF), ultra-high frequency (UHF), or microwave frequency.

8. The method of claim 1 wherein the plasma reactor is a microwave plasma reactor comprising:
i) a field-enhancing waveguide serving as a reaction chamber in which the plurality of carbon particles is produced, the field-enhancing waveguide having:
a field-enhancing zone having a decreasing cross-sectional area between a first cross-sectional area and a second cross-sectional area of the field-enhancing waveguide, wherein the second cross-sectional area is smaller than the first cross-sectional area; and
a reaction zone formed by the second cross-sectional area extending along a reaction length of the field-enhancing waveguide; and
ii) a microwave energy source that is coupled to the field-enhancing waveguide and provides microwave energy into the first cross-sectional area of the field-enhancing zone, wherein the microwave energy propagates in a direction along the reaction length of the reaction zone;
wherein the microwave plasma reactor is absent of a dielectric barrier between the field-enhancing zone and the reaction zone.

9. The method of claim 1 wherein the functionalizing is performed in a plasma of or a high temperature plume of the plasma reactor.

10. The method of claim 1 wherein:
the binder is a resin; and
the functionalizing comprises functionalizing the plurality of carbon particles to be compatible with the resin by promoting chemical bonding between the plurality of carbon particles and the resin.

11. The method of claim 1 wherein the plurality of carbon particles has an average starting particle size; and
the method further comprises adding energy to the composite material during the combining, wherein the energy causes the plurality of carbon particles to be reduced to an average final particle size that is less than the average starting particle size.

12. The method of claim 11, wherein:
the producing of the plurality of carbon particles comprises engineering defects into intentional defect locations in the carbon particles; and
wherein the average final particle size is determined by the intentional defect locations.

13. A method of producing a composite material, the method comprising:
producing a plurality of carbon particles in a plasma reactor;
functionalizing, in the plasma reactor, the plurality of carbon particles to promote chemical bonding with a resin; and
combining, within the plasma reactor, the functionalized plurality of carbon particles with the resin to form the composite material.

14. The method of claim 13 wherein the functionalizing is performed in a plasma or a high temperature plume of the plasma reactor.

15. The method of claim 13 wherein the functionalizing comprises oxidation, nitridation, surface doping, surface alloying, or adding a hardening agent.

16. The method of claim 13 wherein the combining is performed in a plasma or a high temperature plume of the plasma reactor.

17. The method of claim 13 wherein the plasma reactor is a microwave plasma reactor; and
the method further comprises:
introducing a plurality of fibers into the microwave plasma reactor; and
modifying the plurality of fibers within a plasma or a thermal high temperature plume of the microwave plasma reactor;
wherein the producing comprises growing the plurality of carbon particles on the modified plurality of fibers.

18. The method of claim 13 wherein:
the plurality of carbon particles comprises 3D graphene;
the 3D graphene comprises a pore matrix and graphene nanoplatelet sub-particles that comprise at least one of: single layer graphene (SLG), few layer graphene (FLG), or many layer graphene (MLG); and
the producing comprises growing the graphene nanoplatelet sub-particles in an X-Y plane and in a Z direction, and wherein the graphene nanoplatelet sub-particles are connected to each other.

19. The method of claim 13 wherein the plurality of carbon particles has a phase purity of graphene nanoplatelets of greater than 99%.

20. The method of claim 13 wherein the plasma reactor is a microwave plasma reactor comprising:
i) a field-enhancing waveguide serving as a reaction chamber in which the plurality of carbon particles is produced, the field-enhancing waveguide having:
a field-enhancing zone having a decreasing cross-sectional area between a first cross-sectional area and a second cross-sectional area of the field-enhancing waveguide, wherein the second cross-sectional area is smaller than the first cross-sectional area; and
a reaction zone formed by the second cross-sectional area extending along a reaction length of the field-enhancing waveguide; and
ii) a microwave energy source that is coupled to the field-enhancing waveguide and provides microwave energy into the first cross-sectional area of the field-enhancing zone, wherein the microwave energy propagates in a direction along the reaction length of the reaction zone;

wherein the microwave plasma reactor is absent of a dielectric barrier between the field-enhancing zone and the reaction zone.

* * * * *